United States Patent
Maegawa et al.

(10) Patent No.: US 10,534,013 B2
(45) Date of Patent: Jan. 14, 2020

(54) SENSOR

(71) Applicant: Panasonic Intellectual Property Management Co., Ltd., Osaka (JP)

(72) Inventors: Yuki Maegawa, Osaka (JP); Hideki Ueda, Aichi (JP); Hideaki Fujiura, Osaka (JP); Takeshi Uemura, Osaka (JP); Hiroshi Nakatsuka, Osaka (JP); Tsuyoshi Sakaue, Fukui (JP); Rie Okamoto, Osaka (JP); Shoya Kida, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 156 days.

(21) Appl. No.: 15/526,333

(22) PCT Filed: Jan. 8, 2016

(86) PCT No.: PCT/JP2016/000067
§ 371 (c)(1),
(2) Date: May 11, 2017

(87) PCT Pub. No.: WO2016/114114
PCT Pub. Date: Jul. 21, 2016

(65) Prior Publication Data
US 2017/0336436 A1 Nov. 23, 2017

(30) Foreign Application Priority Data

Jan. 15, 2015 (JP) .................... 2015-005640
Feb. 4, 2015 (JP) .................... 2015-020503
Mar. 13, 2015 (JP) .................... 2015-050834

(51) Int. Cl.
*H05K 5/00* (2006.01)
*G01P 1/02* (2006.01)
(Continued)

(52) U.S. Cl.
CPC .......... *G01P 15/125* (2013.01); *H05K 5/0078* (2013.01); *H05K 5/0091* (2013.01);
(Continued)

(58) Field of Classification Search
CPC .......... G01P 15/08; G01P 15/125; G01P 1/02; G01P 1/023; H05K 5/0078; H05K 5/0091;
(Continued)

(56) References Cited

U.S. PATENT DOCUMENTS 3,737,729 A * 6/1973 Carney ................ H05K 3/3405
361/740
4,879,589 A * 11/1989 Saint-Cyr ............... H01L 21/50
257/703
(Continued)

FOREIGN PATENT DOCUMENTS

DE 102009011614 A1 * 9/2010 ............. B60R 11/02
JP 2006-010625 1/2006
(Continued)

OTHER PUBLICATIONS

Babak Vakili Amini, Reza Abdolvand, Farrokh Ayazi, "A 4.5-mW Closed-Loop Delta-Sigma Micro-Gravity CMOS SOI Accelerometer", Dec. 2006, IEEE Journal of Solid-State Circuits, vol. 41, No. 12, pp. 2983-2991 (Year: 2006).*
(Continued)

*Primary Examiner* — David A Rogers
(74) *Attorney, Agent, or Firm* — McDermott Will & Emery LLP

(57) ABSTRACT

A sensor includes a sensor element, a package accommodating the sensor element in an inside of the package, a grounding electrode disposed in the package, a lid covering an opening of the package, and a lead extending from the package. The lead includes first and second portions. The
(Continued)

first portion of the lead is electrically connected to the grounding electrode and extends along a side surface of the package with a gap provided between the first portion and the side surface. The second portion of the lead is disposed between the lid and the package and extends toward the inside of the package. In this sensor, the opening can be sealed without soldering and reliably connect the lid to the grounding electrode.

20 Claims, 36 Drawing Sheets

(51) Int. Cl.
    *G01P 15/125*         (2006.01)
    *H05K 5/02*           (2006.01)
    *H05K 5/03*           (2006.01)
(52) U.S. Cl.
    CPC ............. *H05K 5/0247* (2013.01); *H05K 5/03* (2013.01); *G01P 1/02* (2013.01)
(58) Field of Classification Search
    CPC .................... H05K 5/0247; H05K 5/03; H01L 2224/05554; H01L 2224/48091; H01L 2224/48137; H01L 2924/16195
    See application file for complete search history.

(56) References Cited

U.S. PATENT DOCUMENTS

| | | | | |
|---|---|---|---|---|
| 5,214,246 | A * | 5/1993 | Maquaire | H01L 25/165 174/50.56 |
| 5,616,521 | A * | 4/1997 | Cook, Sr. | G01L 19/0038 29/840 |
| 5,864,062 | A * | 1/1999 | Nagahara | B81C 1/0023 257/417 |
| 6,040,625 | A * | 3/2000 | Ip | B81B 7/007 257/719 |
| 6,404,046 | B1 * | 6/2002 | Glenn | H01L 23/3107 257/678 |
| 6,492,699 | B1 * | 12/2002 | Glenn | H01L 27/14618 257/433 |
| 6,518,659 | B1 * | 2/2003 | Glenn | H01L 23/043 257/686 |
| 7,071,597 | B2 * | 7/2006 | Lee | H01L 41/1132 310/311 |
| 8,193,555 | B2 * | 6/2012 | Lin | H01L 27/14618 257/294 |
| 8,810,023 | B2 * | 8/2014 | Koduri, Sr. | G01P 15/0802 257/692 |
| 9,585,264 | B2 * | 2/2017 | Tanaka | H01L 23/057 |
| 9,676,610 | B2 * | 6/2017 | Takada | B81B 7/0064 |
| 10,015,882 | B1 * | 7/2018 | Murdock | H05K 1/181 |
| 10,240,953 | B2 * | 3/2019 | Hansen | B81B 7/0058 |
| 2008/0030205 | A1 * | 2/2008 | Fujii | B81B 7/02 324/661 |
| 2008/0073739 | A1 * | 3/2008 | Kitamura | H01L 23/055 257/433 |
| 2010/0072862 | A1 * | 3/2010 | Berger | B81B 7/0058 310/370 |
| 2012/0038352 | A1 * | 2/2012 | Elian | G01R 33/072 324/239 |
| 2012/0147922 | A1 | 6/2012 | Lau et al. | |
| 2012/0280334 | A1 | 11/2012 | Yosida et al. | |
| 2014/0346623 | A1 * | 11/2014 | Elian | G01L 19/147 257/417 |
| 2016/0013112 | A1 * | 1/2016 | Lhle; Jan | G01D 11/245 257/414 |
| 2019/0049484 | A1 * | 2/2019 | Yanagisawa | G01P 15/0802 |

FOREIGN PATENT DOCUMENTS

| | | |
|---|---|---|
| JP | 2007-101203 | 4/2007 |
| JP | 2011-047775 | 3/2011 |
| JP | 2011-112391 | 6/2011 |
| JP | 2014-238281 | 12/2014 |

OTHER PUBLICATIONS

International Search Report of PCT application No. PCT/JP2016/000067 dated Mar. 29, 2016.

\* cited by examiner

FIG. 8
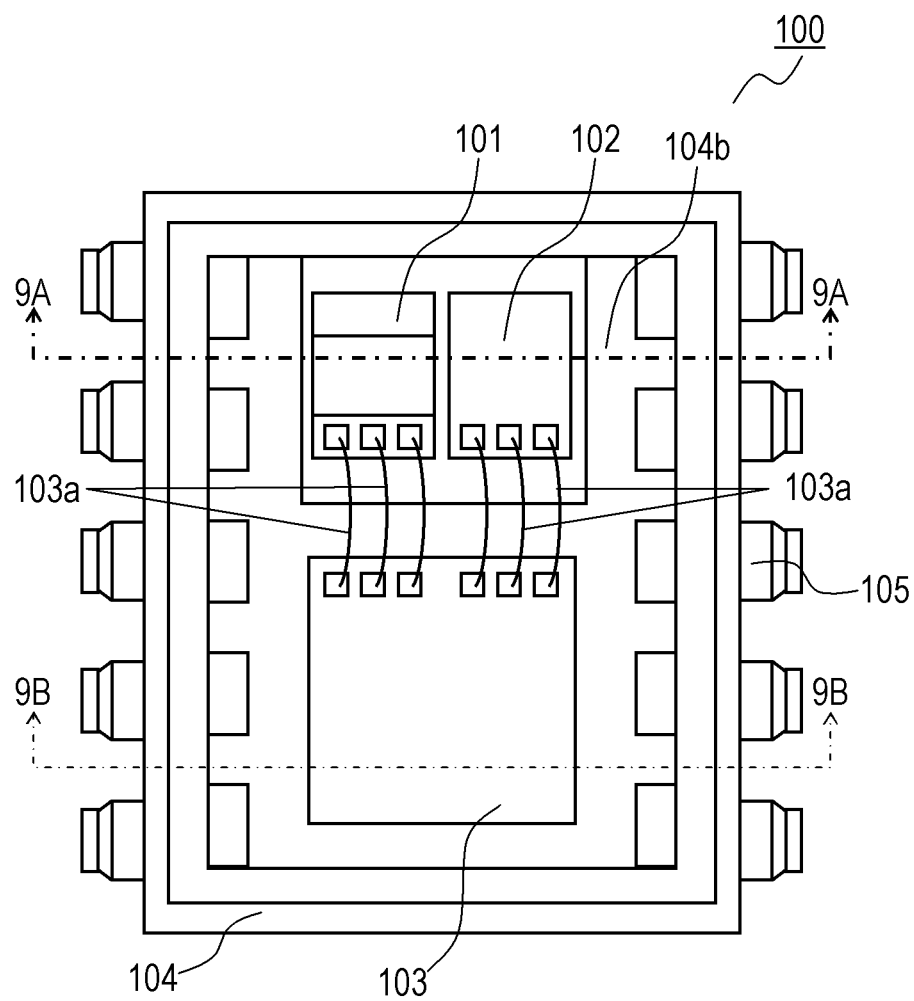
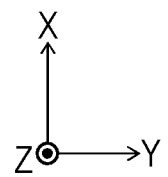

SENSOR

CROSS-REFERENCE TO RELATED APPLICATIONS

This application is a U.S. national stage application of the PCT international application No. PCT/JP2016/000067 filed on Jan. 8, 2016, which claims the benefit of foreign priority of Japanese patent application No. 2015-005640 filed on Jan. 15, 2015, Japanese patent application No. 2015-020503 filed on Feb. 4, 2015, and Japanese patent application No. 2015-050834 filed on Mar. 13, 2015, the contents all of which are incorporated herein by reference.

TECHNICAL FIELD

The present invention relates to a sensor for use in electronic equipment.

BACKGROUND ART

FIG. 36 is an exploded perspective view of conventional sensor 90. A conventional semiconductor package includes sensor element 1, circuit component 2a, package 3, metal lid 4, and electrode 5. Electrode 5 is connected to the ground. Metal lid 4 and package 3 are joined together by soldering.

A conventional sensor similar to sensor 90 is disclosed in, for example, PTL 1.

PTL 2 discloses a sensor element that detects an acceleration.

These conventional sensors employ soldering for joining, and thus, costs are required for maintaining connection between a grounding electrode and a metal lid and for sealing.

A conventional sensor disclosed in PTL 3 includes beams rotatably supporting plummets, and detects accelerations along two axes.

PTL 4 discloses a sensor element that detects an angular velocity.

A conventional sensor disclosed in PTL 5 includes a sensor unit, an integration unit, and a comparator. The integration unit samples an output signal of the sensor unit at a predetermined sampling frequency, and then, integrates the sampled signal. The comparator compares a voltage value of an output signal from the integration unit with a reference voltage. The comparator can finish an integration process performed by the integration unit when an output voltage of the integration unit reaches a predetermined voltage (e.g., reference voltage Vref). In PTL 5, the sampling is performed at the predetermined sampling frequency to prevent a noise component from passing as to reduce a noise component entering in a voltage signal from the sensor unit. That is, the integration unit performs noise reduction.

CITATION LIST

Patent Literature

PTL 1: Japanese Patent Laid-Open Publication No. 2006-10625

PTL 2: Japanese Patent Laid-Open Publication No. 2014-238281

PTL 3: Japanese Patent Laid-Open Publication No. 2011-112391

PTL 4: Japanese Patent Laid-Open Publication No. 2007-101203

PTL 5: Japanese Patent Laid-Open Publication No. 2011-47775

SUMMARY

A sensor includes a sensor element, a package accommodating the sensor element in an inside of the package, a grounding electrode disposed in the package, a lid covering an opening of the package, and a lead extending from the package. The lead includes first and second portions. The first portion of the lead is electrically connected to the grounding electrode and extends along a side surface of the package with a gap provided between the first portion and the side surface. The second portion of the lead is disposed between the lid and the package and extends toward the inside of the package.

In this sensor, the opening can be sealed without soldering and reliably connect the lid to the grounding electrode.

BRIEF DESCRIPTION OF DRAWINGS

FIG. 8 is a top view of the package substrate of the sensor according to Embodiment 2 for illustrating the inside of the package substrate.

DETAIL DESCRIPTION OF PREFERRED EMBODIMENTS

Exemplary Embodiment 1

Figure 1A:
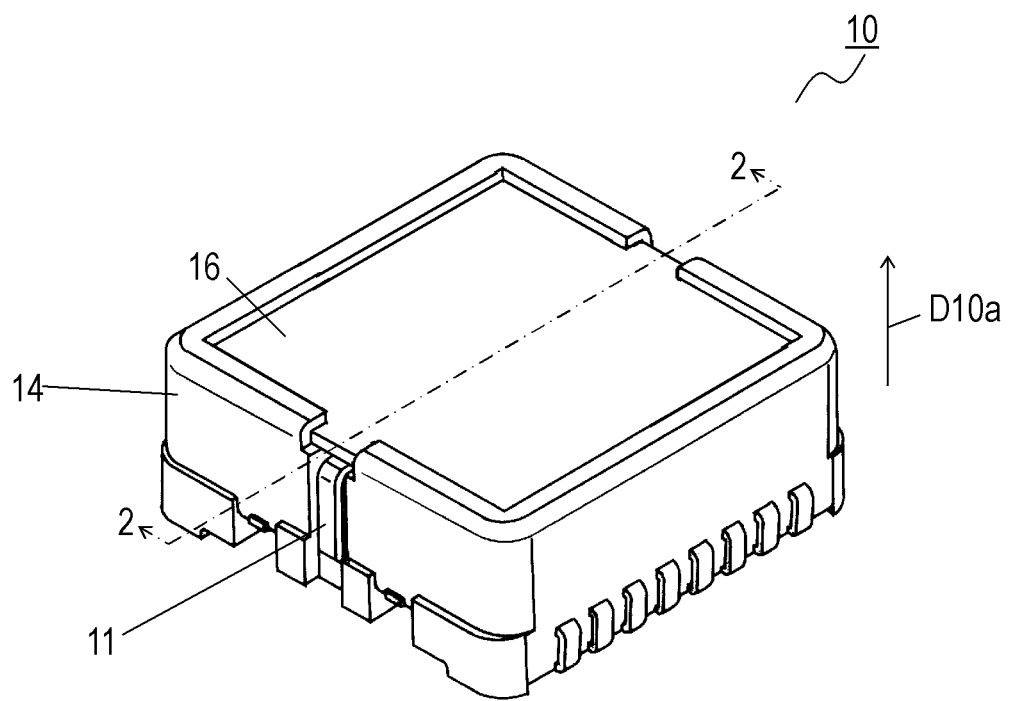
FIG. 1A is a perspective view of a sensor according to Exemplary Embodiment 1.
Figure 1B:
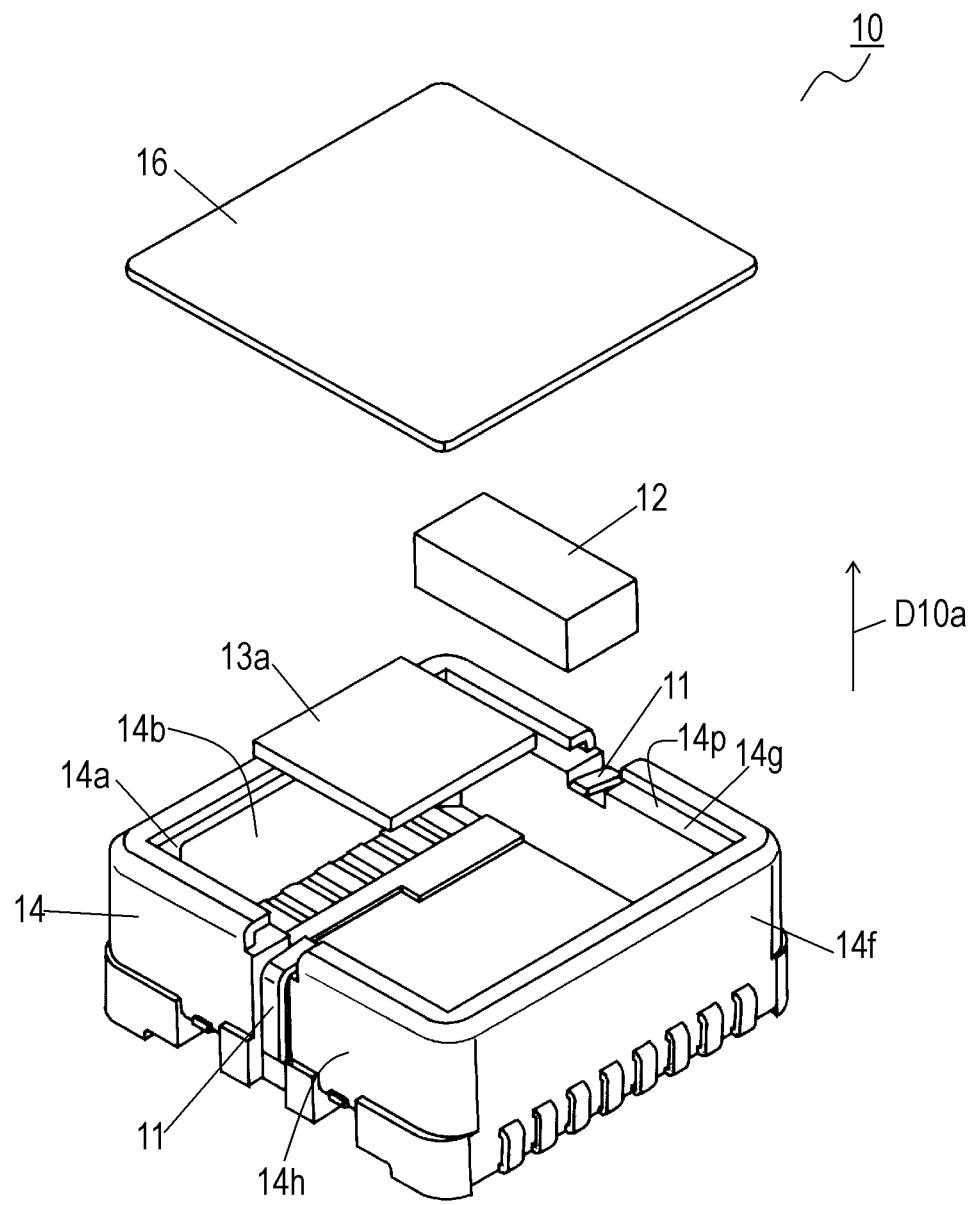
FIG. 1B is an exploded perspective view of the sensor according to Embodiment 1.
Figure 2:
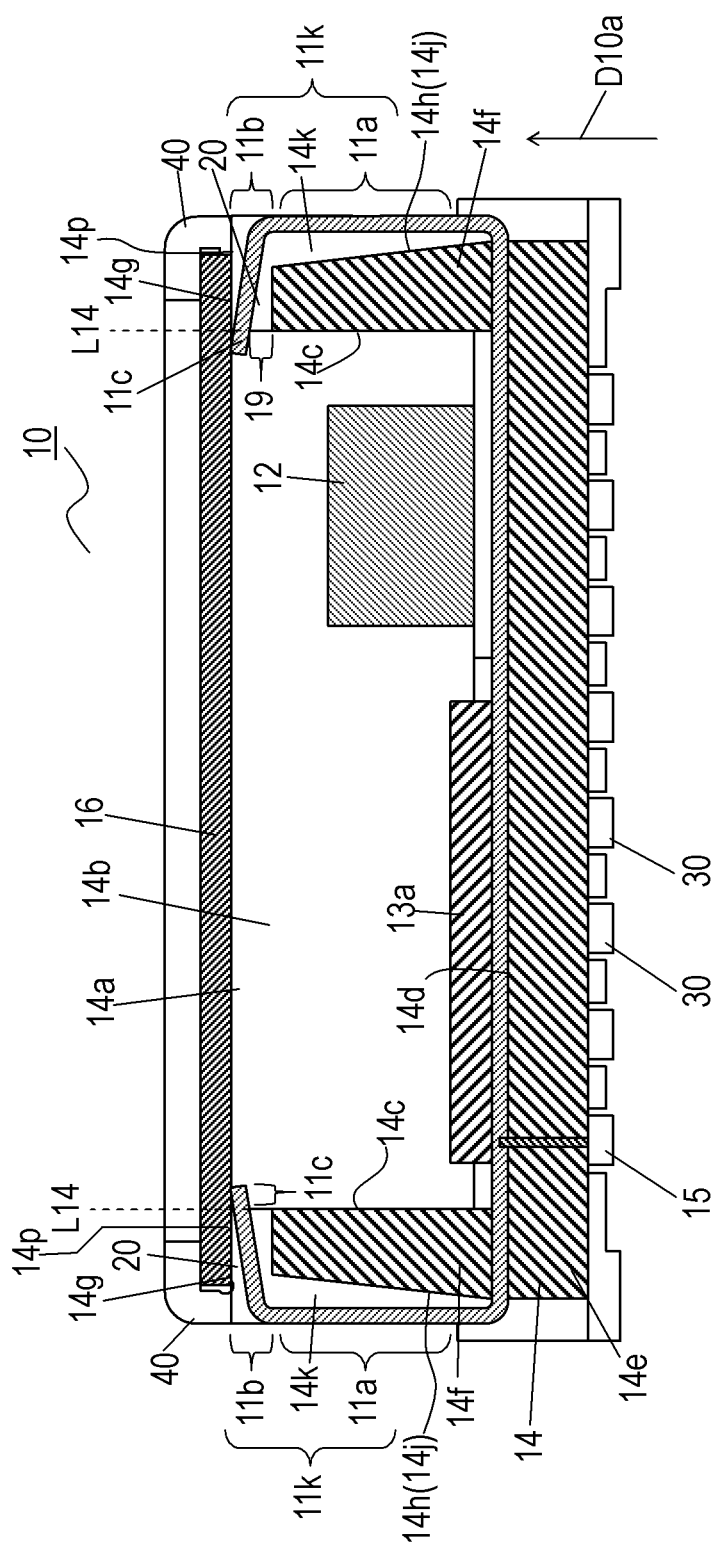
FIG. 2 is a cross-sectional view of the sensor according to Embodiment 1.

FIGS. 1A and 1B are a perspective view and an exploded perspective view of sensor 10 according to Exemplary Embodiment 1, respectively. FIG. 2 is a cross-sectional view of sensor 10.

Sensor 10 includes sensor element 12, package 14 accommodating sensor element 12 therein, grounding electrode 15 provided in package 14, lid 16 covering opening 14a of package 14, and lead 11 extending from package 14.

Sensor element 12 is, for example, a device that detects an acceleration.

Circuit component 13a is electrically connected to sensor element 12 through, for example, a metal wire, processes an electrical signal, such as a signal indicating an acceleration, output from sensor element 12, and outputs the processed signal to the outside of package 14.

Lid 16 is made of a metal material, such as stainless steel, and is disposed at a position to cover opening 14a of package 14. In other words, lid 16 is located at a position to cover sensor element 12 and circuit component 13a.

Sensor 10 includes lead 11 extending from package 14, sensor element 12 disposed on an upper surface of lead 11, circuit component 13a disposed on the upper surface of lead 11, package 14 accommodating therein sensor element 12 and circuit component 13a, grounding electrode 15 electrically connected to lead 11, and lid 16 covering an opening of package 14.

Package 14 is made of, for example, a resin material such as liquid crystal polymer. Package 14 has bottom part 14e and side wall 14f which extends from bottom part 14e in upward direction D10a and which surrounds internal space 14b. Internal space 14b opens to outside of package 14 through opening 14a. Side wall 14f of package 14 has inner wall surface 14c facing the internal space opposite to side surface 14h. Side surface 14h of side wall 14f of package 14 has portion 14j that faces lead 11 and inclines more inward as approaching lid 16. The "inward" here refers to a direction toward the space in which circuit component 13a and sensor element 12 are accommodated. Large space 14k can be formed between lead 11 and portion 14j of side surface 14h of package 14, and allows lead 11 to be bent easily, hence allowing lead 11 to have a spring function. Lead 11 is electrically connected to lid 16.

Lead 11 includes portion ilk projecting from package 14. Portion ilk of lead 11 includes portions 11a and 11b.

Portion 11a of lead 11 projects from package 14 and extends along side surface 14h of package 14. In FIG. 2, portion 11a of lead 11 extends in upward direction D10a, but is not limited to this direction. For example, portion 11a of lead 11 may extend along the inward slope of side surface 14h of package 14.

Portion 11a is electrically connected to grounding electrode 15. In this manner, a potential of lid 16 connected to portion 11b of lead 11 can be reduced to a ground potential.

Portion 11b of lead 11 extends toward the inside of package 14, and is sandwiched between lid 16 and package 14. Portion 11b of lead 11 is thus electrically connected to lid 16.

This configuration causes tip 11c (portion 11b) of bent lead 11 to be pressed onto lid 16 by a spring force, hence maintaining electrical connection between lead 11 and lid 16 stably.

Figure 3:
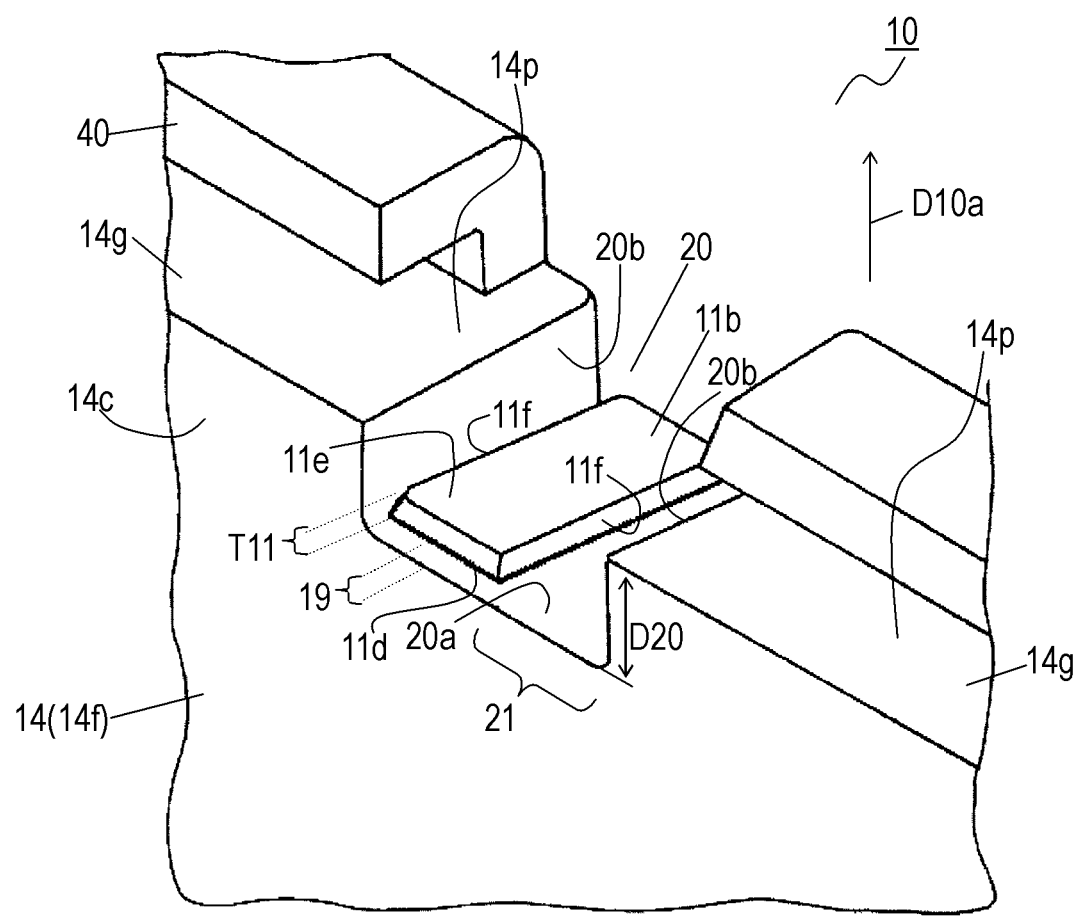
FIG. 3 is an enlarged view of the sensor according to Embodiment 1.

FIG. 3 is an enlarged view of the sensor according to Embodiment 1. Portion 11b is disposed in recess 20 formed in upper edge 14g of side wall 14f of package 14. Upper edge 14g of side wall 14f constitutes upper surface 14p of package 14. Recess 20 has bottom surface 20a and inner side surfaces 20b extending from bottom surface 20a and connected to upper surface 14p of upper edge 14g of package 14.

The depth of recess 20, that is, the distance from bottom surface 20a to upper surface 14p in upward direction D10a, is preferably larger than thickness T11 of portion 11b of lead 11. In this case, upon having lid 16 be attached to the package, gap 19 is formed between bottom surface 20a of recess 20 of package 14 and portion 11b of lead 11. In this configuration, it is determined whether or not lead 11 appropriately contacts lid 16 with an X-ray inspection performed in a transverse direction, hence simplifying the inspection. The depth of recess 20 is not necessarily larger than thickness T11 of portion 11b. For example, the depth of recess 20 may be substantially equal to thickness T11 of portion 11b. In this case, upper edge 14g of package 14 can be substantially flush with portion 11b of lead 11, thereby reducing the size of package 14.

Portion 11b of lead 11 has side surface 11f facing inner side surface 20b of recess 20. As illustrated in FIG. 3, side surface 11f of portion 11b is preferably apart from inner side surface 20b of recess 20 of package 14 with gap 21 between side surface 11f of portion 11b and inner side surface 20b of recess 20. This configuration prevents side surface 11f of portion 11b from not being restrained by package 14, that is, prevents package 14 from disabling portion 11b to move, hence preventing package 14 from reducing a spring property of lead 11. Tip 11c of portion 11b projects inward with respect to inner wall surface 14c of package 14 (line L14 shown in FIG. 2), that is, toward internal space 14b. In this configuration, it is determine whether or not lead 11 is appropriately disposed with an X-ray inspection in upward direction D11a, for example, so that the inspection can be simplified.

Plural terminals 30 connected to an external substrate extend from package 14.

A method for manufacturing sensor 10 having the above configuration will be described below.

Figure 4:
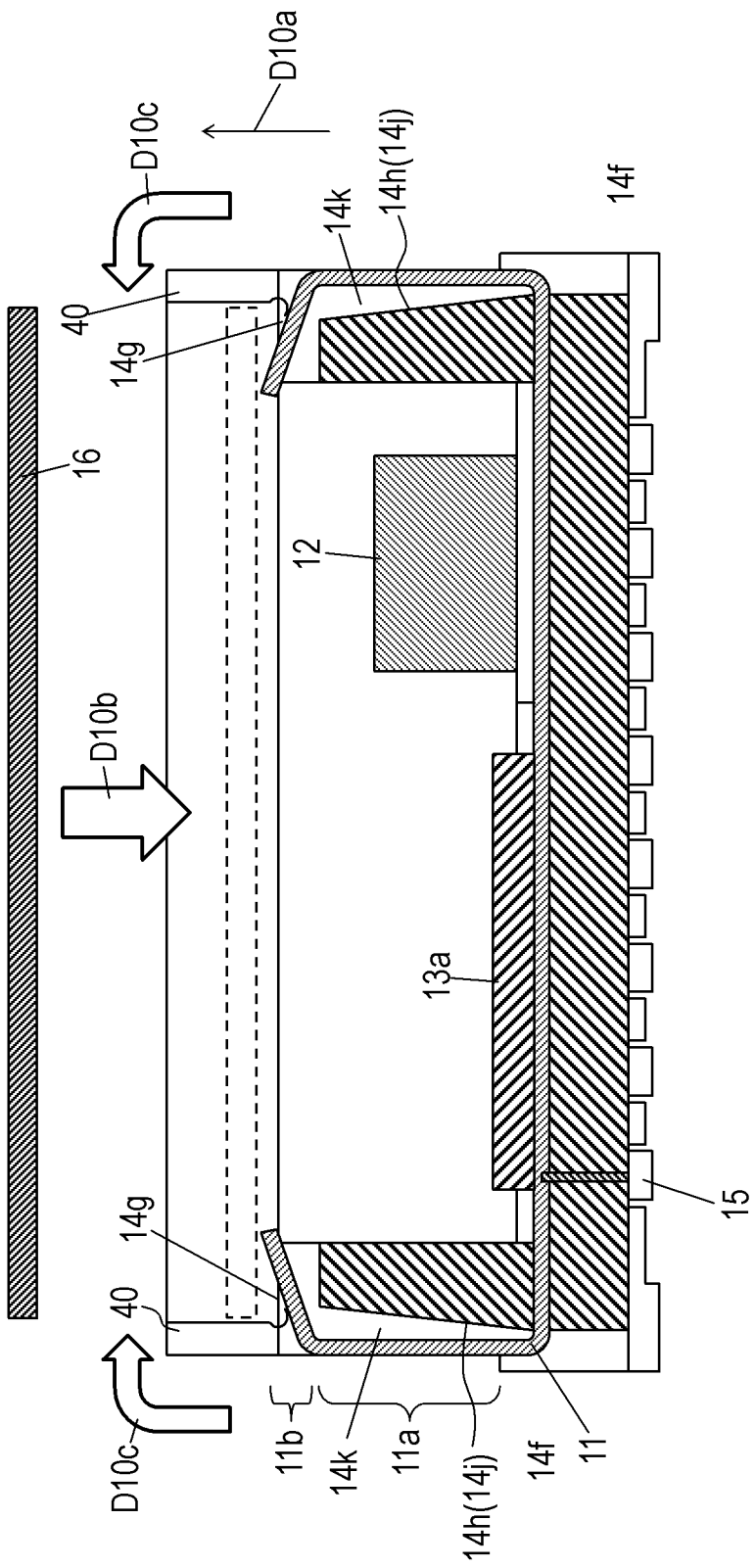
FIG. 4 is a diagram for illustrating a process for manufacturing the sensor according to Embodiment 1.

FIG. 4 is a cross-sectional view of sensor 10 for illustrating a process for manufacturing sensor 10.

End 40 of package 14 projects in upward direction D10a from upper surface 14p of upper edge 14g of side wall 14f of package 14. First, as illustrated in FIG. 4, sensor element 12 and circuit component 13a are fixed to bottom part 14e of package 14 with, for example, an adhesive.

Next, lid 16 is disposed while pushing the tip (portion 11b) of lead 11, and end 40 of package 14 is bent inward so that lid 16 is sandwiched between end 40 and the tip (portion 11b) of lead 11, and fixed.

This process connects lid 16 to grounding electrode 15 so that sensor element 12 and circuit component 13a in package 14 can be shielded, and thereby, can be electrically protected against external electromagnetic waves and static electricity.

Since lead 11 connected to lid 16 is bent by a bending process so that space 14k is formed at side surface 14h of package 14, tip 11c of lead 11 connected to lid 16 is used as a spring and tip 11c is continuously pushed onto lid 16. Thus, a process using soldering, for example, can be eliminated.

In accordance with Embodiment 1, lid 16 is placed in downward direction D10b, and then, end 40 of the package is bent in direction D10c so that lid 16 is caught in resin and fixed. Thus, a fixing process using an adhesive, for example, can be eliminated.

Figure 5:
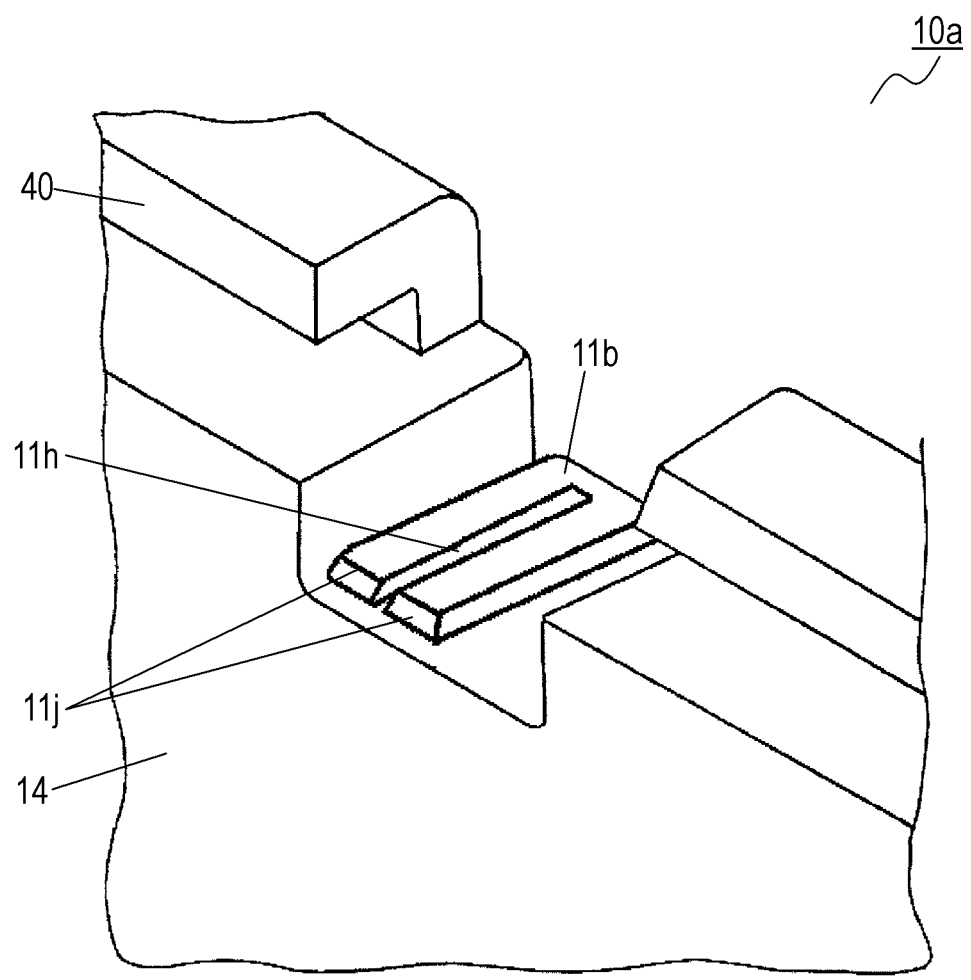
FIG. 5 is an enlarged view of another sensor according to Embodiment 1.

FIG. 5 is an enlarged view of another sensor 10a according to Embodiment 1. In FIG. 5, components identical to those of sensor 10 illustrated in FIGS. 1A to 4 are denoted by the same reference numerals. In sensor 10a, portion 11b of lead 11 is split into two portions 11j by slit 11h. In other words, portion 11b of lead 11 has slit 11h provided therein. In sensor 10a, even if one of two portions 11j of lead 11 loses a spring property, the other can contact lid 16.

Slit 11h is disposed substantially at the center of portion 11b of lead 11 in a width direction.

Figure 6:
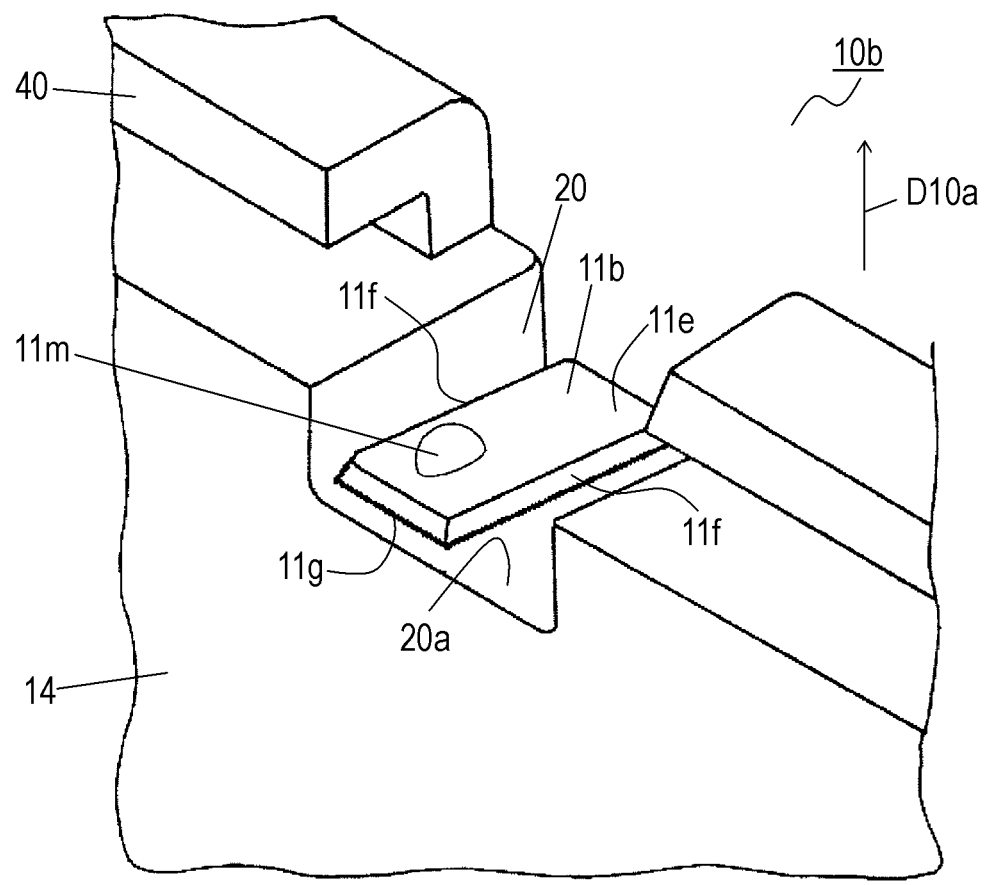
FIG. 6 is an enlarged view of still another sensor according to Embodiment 1.

FIG. 6 is an enlarged view of still another sensor 10b according to Embodiment 1. In FIG. 6, components identical to those of sensor 10 illustrated in FIGS. 1A to 4 are denoted by the same reference numerals. Portion 11b of lead 11 has lower surface 11g and upper surface 11e opposite to lower surface 11g. Lower surface 11g faces bottom surface 20a of recess 20. Upper surface 11e faces in upward direction D10a. Side surface 11f is connected to upper surface 11e and lower surface 11g. In sensor 10b, portion 11b of lead 11 has projection 11m projecting from upper surface 11e in upward direction D10a. Even if cutting chips are placed on a surface of portion 11b, lid 16 contacts portion 11b of lead 11 without fail.

Projection 11m is disposed substantially at the center of portion 11b in the width direction. Projection 11m is disposed on upper surface 11e of portion 11b of lead 11 facing lid 16.

Projection 11m illustrated in FIG. 6 has a semi-sphere shape, but may have another shape, such as a conical shape or a pyramid shape.

Exemplary Embodiment 2

Figure 7A:
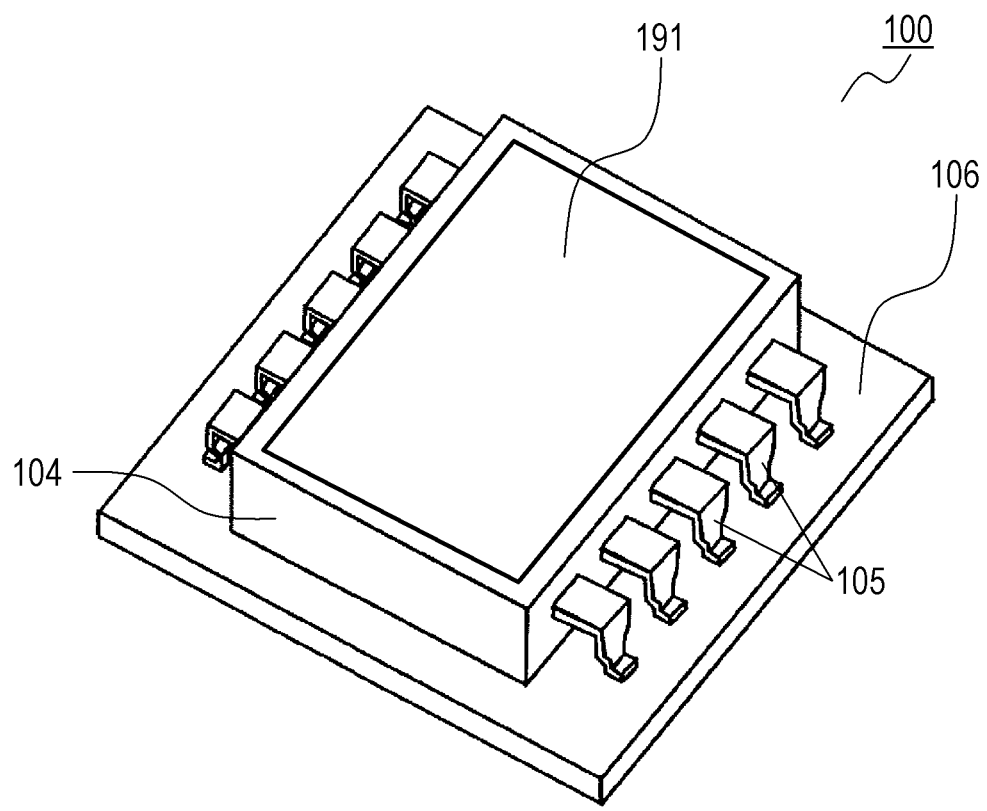
FIG. 7A is a perspective view of a sensor according to Exemplary Embodiment 2.

FIG. 7A is a perspective view of sensor 100 according to Exemplary Embodiment 2. Sensor 100 includes package substrate 104, lead terminal 105 projecting from package substrate 104, and lid 191 provided on package substrate 104.

Figure 7B:
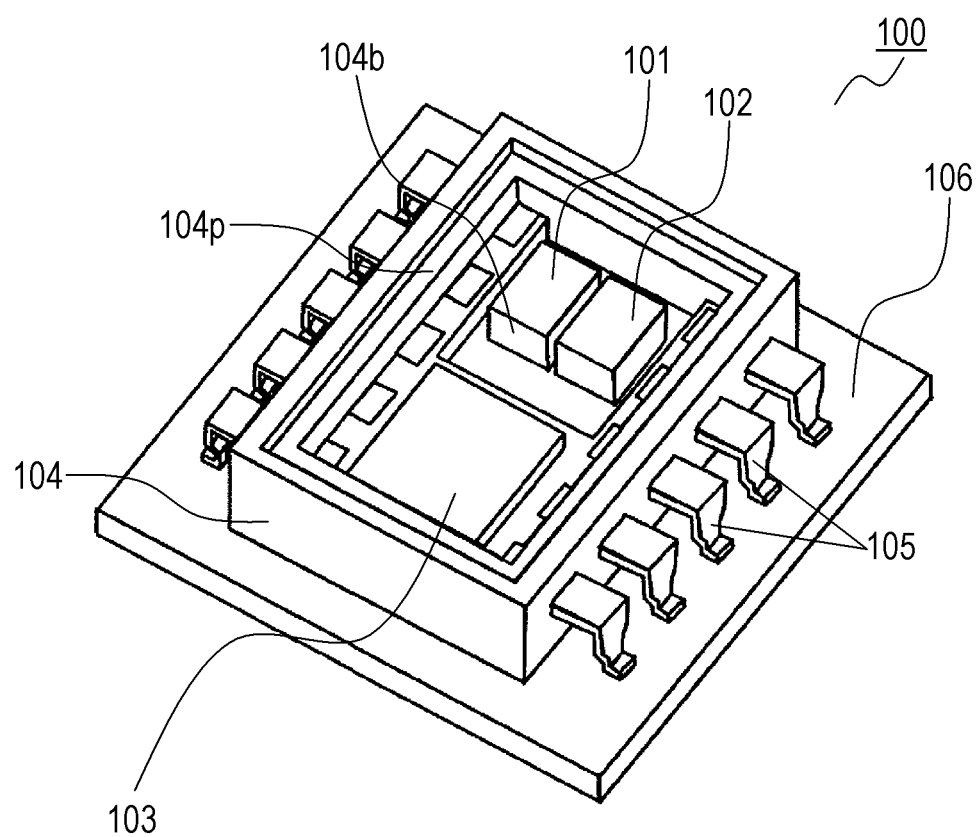
FIG. 7B is a perspective view of a package substrate of the sensor according to Embodiment 2 for illustrating an inside of the package substrate.

FIG. 7B is a perspective view of sensor 100 for illustrating an internal configuration of package substrate 104 having sensor elements 101 and 102 of sensor 100 mounted thereon. FIG. 7B illustrates sensor 100 while lid 191 of package substrate 104 mounted on external substrate 106 opens.

Package substrate 104 has internal space 104b therein which opens at opening 104p. Lid 191 covers opening 104p. Sensor elements 101 and 102 and detection circuit 103 are mounted on bottom surface 104c of internal space 104b of package substrate 104. Detection circuit 103 is electrically connected to sensor elements 101 and 102, performs various operations based on outputs from sensor elements 101 and 102, and detects a physical quantity.

Lead terminal 105 is drawn from package substrate 104. Lead terminal 105 extending from package substrate 104 is configured to be connected to external substrate 106.

Sensor 100 is a capacitance type sensor that detects an acceleration. Sensor 100 is fabricated by a MEMS technique.

Each of sensor elements 101 and 102 includes a plummet for detecting an acceleration in a direction along a Z-axis and a plummet for detecting an acceleration in a direction along an X-axis. That is, plural plummets are provided in each of sensor elements 101 and 102 to detect accelerations in two-axis directions.

FIG. 8 is a top view of sensor 100. Sensor elements 101 and 102 are connected to detection circuit 103 with conductive wires 103a made of metal. FIG. 7B does not show conductive wires 103a.

Figure 9A:
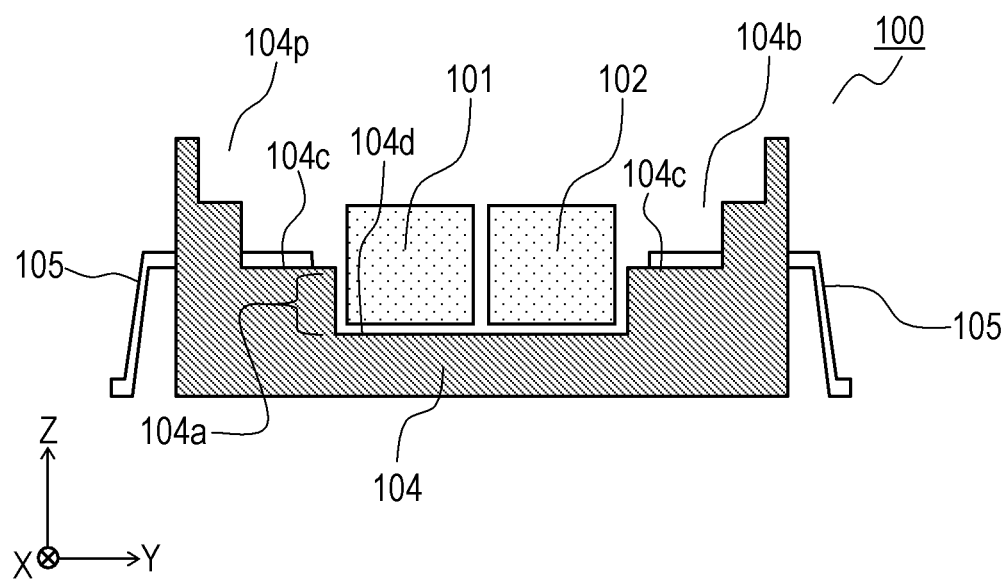
FIG. 9A is a cross-sectional view of the sensor along line 9A-9A illustrated in FIG. 8.
Figure 9B:
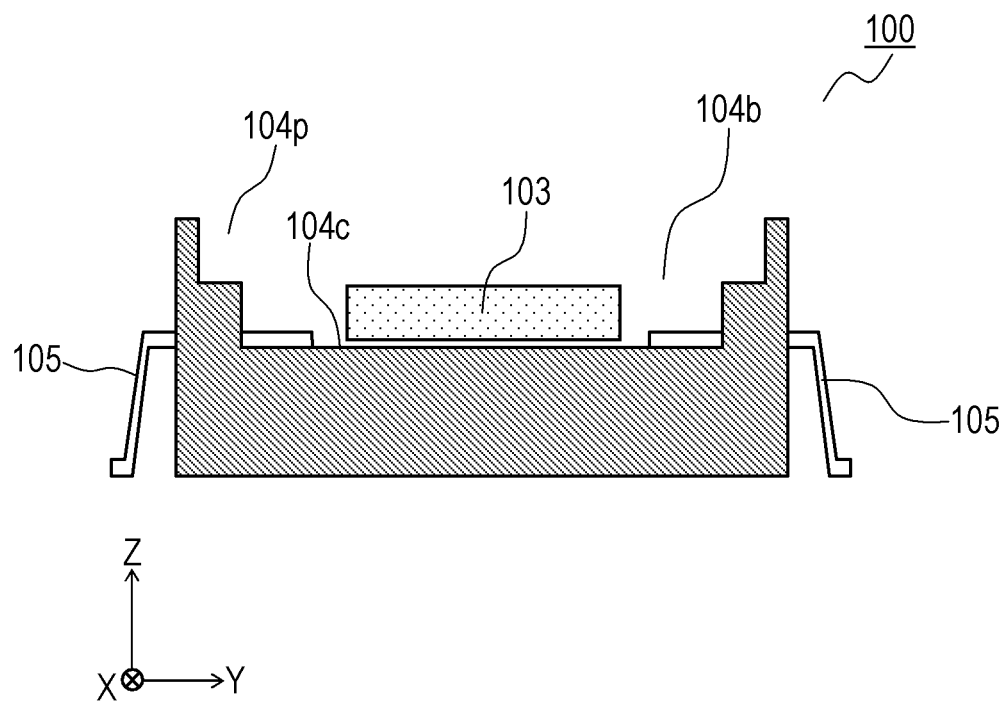
FIG. 9B is a cross-sectional view of the sensor along line 9B-9B illustrated in FIG. 8.

FIG. 9A is a cross-sectional view of sensor 100 along line 9A-9A shown in FIG. 8. FIG. 9B is a cross-sectional view of sensor 100 along line 9B-9B shown in FIG. 8.

Bottom surface 104c of internal space 104b in package substrate 104 has recess 104a therein having bottom surface 104d. Sensor elements 101 and 102 are disposed side by side on bottom surface 104d of recess 104a of package substrate 104.

Figure 10A:
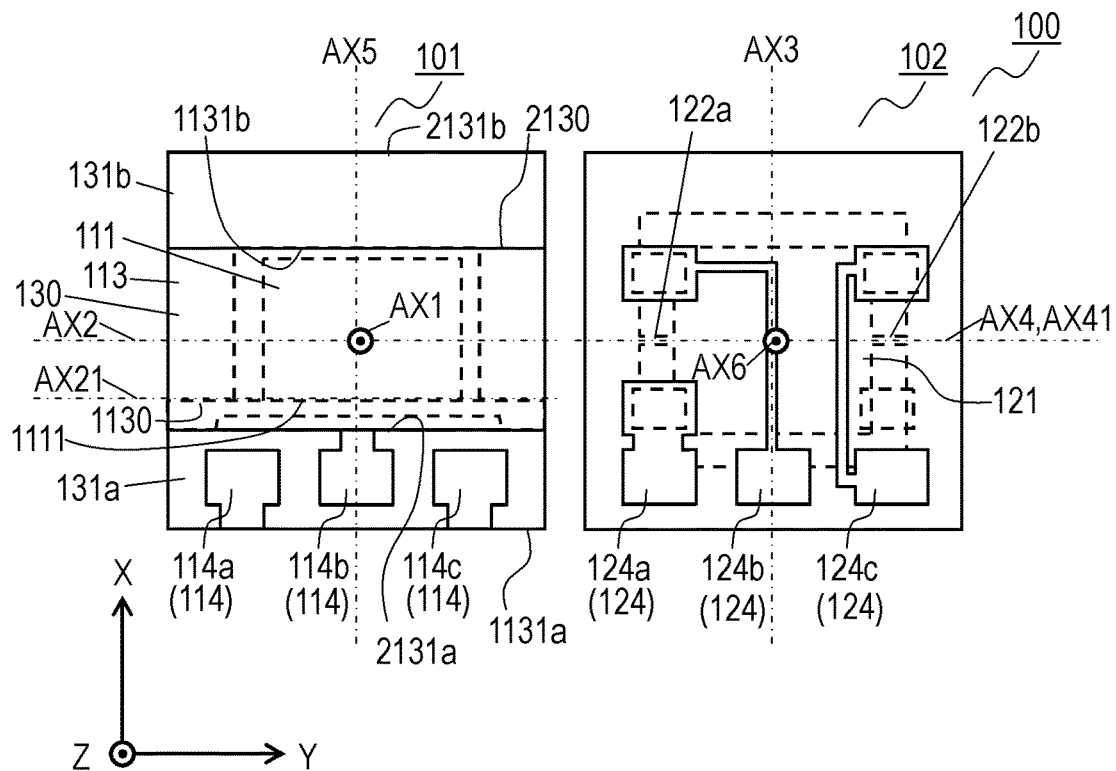
FIG. 10A is a plan view of a sensor element of the sensor according to Embodiment 2.
Figure 10B:
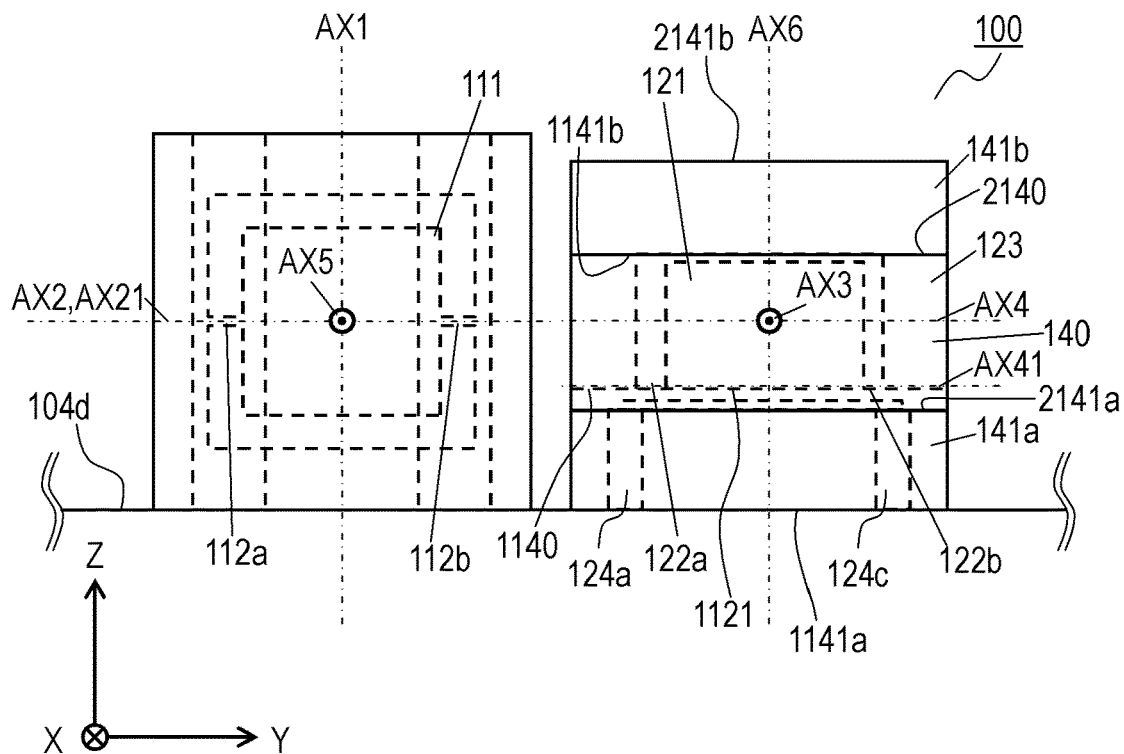
FIG. 10B is a cross-sectional view of the sensor element illustrated in FIG. 10A.
Figure 11:
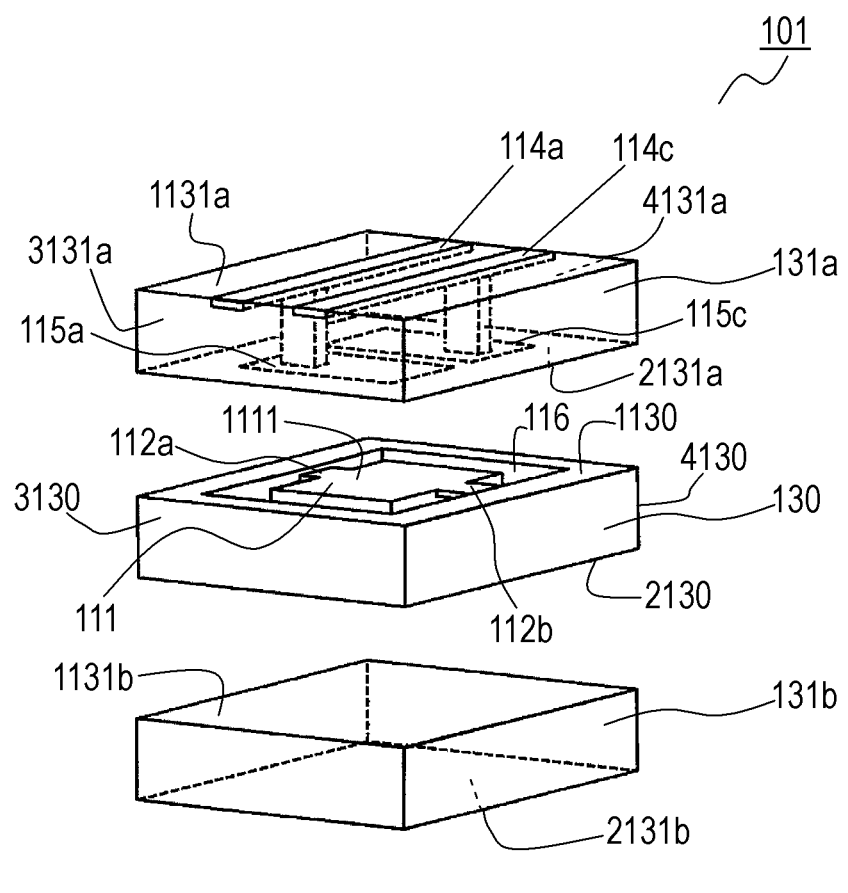
FIG. 11 is an exploded perspective view of the sensor element of the sensor according to Embodiment 2.

FIG. 10A is a top view of sensor elements 101 and 102. FIG. 10B is a cross-sectional view of sensor elements 101 and 102 and shown cross sections of sensor elements 101 and 102 along line 9A-9A shown in FIG. 8. FIG. 11 is an explode perspective view of sensor element 101. Sensor element 101 includes substrates 130, 131a, and 131b attacked on one another. Substrate 130 is disposed between substrates 131a and 131b. Substrate 130 has surface 1130, surface 2130 opposite to surface 1130, and surfaces 3130 and 4130 opposite to each other connected to surfaces 1130 and 2130. Substrate 131a has surface 1131a, surface 2131a opposite to surface 1131a, and side surfaces 3131a and 4131a opposite to each other connected to surfaces 1131a and 2131a. Substrate 131b has surface 1131b and surface 2131b opposite to surface 1131b. Surface 2131a of substrate 131a is joined to surface 1130 of substrate 130. Surface 1131b of substrate 131b is joined to surface 2130 of substrate 130. Side surface 3130 of substrate 130 is flush with side surface 3131a of substrate 131a. Side surface 4130 of substrate 130 is flush with side surface 4131a of substrate 131a.

Substrate 130 includes support part 113 having a frame shape surrounding internal space 116, plummet 111, and a pair of beams 112a and 112b connecting plummet 111 to support part 113. Plummet 111 detects an acceleration in a direction along axis AX1 while sensor 100 detects an acceleration in a direction along the Z-axis.

Plummet 111 functions as an electrode. In the following description, when attention is given on the function of plummet 111 as an electrode, plummet 111 is represented as common electrode 111m. Plummet 111 has surface 1111 facing surface 2131a of substrate 131a.

Substrate 131a is provided with fixed electrodes 115a and 115c and via-conductors 114a and 114c for extracting electrical signals from fixed electrodes 115a and 115c to an outside of substrate 131a. Fixed electrodes 115a and 115b are disposed on surface 2131a of substrate 131a. Fixed electrodes 115a and 115b face surface 1111 of plummet 111 with gaps interposed between surface 1111 of plummet 111 and each of fixed electrodes 115a and 115b.

An end face of each via-conductor is covered with metal plating or other materials serving as an electrode pad for connection to a conductive wire, and the via-conductor includes an electrode pad.

Substrate 131b is disposed on bottom surface 104d of recess 104a of package substrate 104.

One or more via-conductors 114a and 114c constitute via-conductor group 114. Via-conductors 114a and 114c extend to side surfaces 3131a and 4131a of substrate 131a in order to ease electrical extraction when sensor element 101 is oriented sideways. In other words, end faces of via-conductors 114a and 114c of via-conductor group 114 are exposed from side surfaces 3131a and 4131a of substrate 131a.

Substrate 130 may be, for example, an SOI substrate. Thus, side surfaces 3130 and 4130 of substrate 130 can be used for extracting an electrical signal from common electrode him (plummet 111) to the outside. The electrical signal from common electrode him can be extracted from via-conductor 114b provided on one side surface 3130 of substrate 130.

The pair of beams 112a and 112b extend along support axis AX21 parallel to axis AX2 perpendicular to axis AX1. Beams 112a and 112b are opposite to each other with respect to plummet 111 on support axis AX21, extend from plummet 111 in directions along support axis AX21 opposite to each other, and are connected to support part 113 having a frame shape to movably support plummet 111 with respect to support part 113 in internal space 116.

That is, axis AX1 and axis AX2 are perpendicular to each other, and extend in parallel with surface 1111 of plummet 111.

Figure 12:
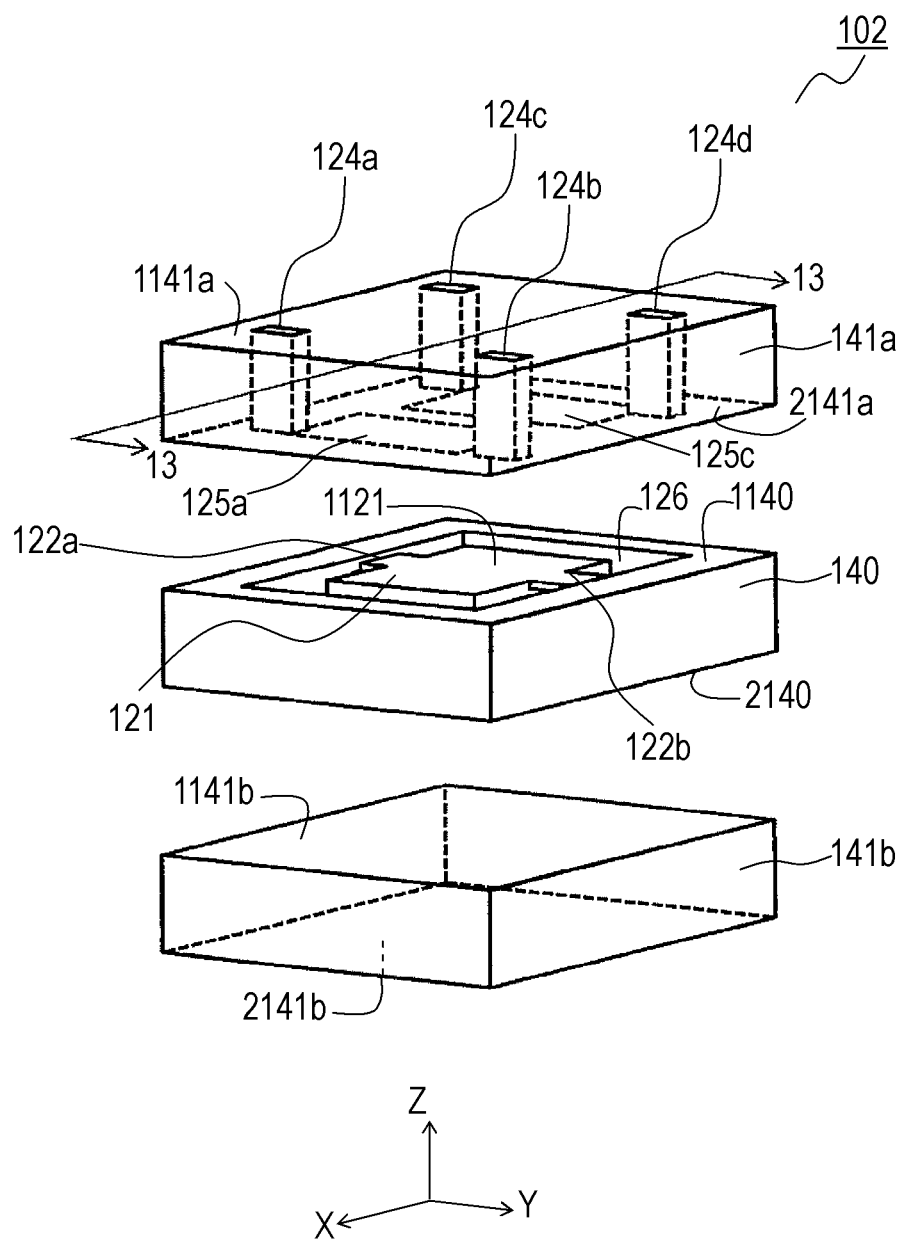
FIG. 12 is an exploded perspective view of another sensor element of the sensor according to Embodiment 2.

FIG. 12 is an exploded perspective view of sensor element 102. Sensor element 102 includes substrates 140, 141a, and 141b stacked on one another. Substrate 140 is disposed between substrate 141a and substrate 141b. Substrate 140 has surface 1140 and surface 2140 opposite to surface 1140. Substrate 141a has surface 1141a and surface 2141a opposite to surface 1141a. Substrate 141b has surface 1141b and surface 2141b opposite to surface 1141b. Surface 2141a of substrate 141a is joined to surface 1140 of substrate 140 while surface 1141b of substrate 141b is joined to surface 2140 of substrate 140.

Substrates 1300 and 140 may be semiconductor substrates containing silicon. Substrates 131a, 131b, 141a, and 141b may contain glass.

Substrate 140 includes support part 123 having a frame shape surrounding internal space 126, plummet 121, and a pair of beams 122a and 122b connecting plummet 121 to support part 123. Plummet 121 detects an acceleration along axis AX3, and sensor 100 detects an acceleration in a direction along the X-axis.

Plummet 121 functions as an electrode. When the following description focuses on the function of plummet 121 as an electrode, plummet 121 is expressed as common electrode 121m. Plummet 121 has surface 1121 facing surface 2141a of substrate 141a with a gap between surfaces 1121 of plummet 121 and surface 2141a of substrate 141a.

Substrate 141a includes fixed electrodes 125a and 125c and via-conductors 124a, 124b, 124c, and 124d. Via-conductors 124a and 124c extract electrical signals obtained from fixed electrodes 125a and 125c to the outside. Via-conductors 124b and 124d extract electrical signals obtained from common electrode 121m to the outside. Fixed electrodes 125a and 125c are disposed on surface 2141a of substrate 141a. Surface 1121 of plummet 121 face fixed electrodes 125a and 125c with a gap between surface 1121 of plummet 121 and each of electrodes 125a and 125c.

Via-conductors 124b and 124d are electrically connected to common electrode 121m (plummet 121).

Substrate 141b is disposed on package substrate 104 such that surface 2141b is disposed on bottom surface 104d of recess 104a of package substrate 104.

Via-conductors 124a, 124b, 124c, and 124d (via-conductor group 124) extend to surface 1141a of substrate 141a as to extract electrical signals from sensor element 101. In other words, respective ends of via-conductors 124a, 124b, 124c, and 124d of via-conductor group 124 are exposed from surface 1141a of substrate 141a.

Each of respective edge surfaces of via-conductors 124a, 124b, 124c, and 124d is covered with a conductive coating, such as metal plating serving as an electrode pad to be connected to conductive wire 103a. Via-conductors 124a, 124b, 124c, and 124d include metal pads similarly to sensor element 101.

The pair of beams 122a and 122b extend along support axis AX41 parallel to axis AX4 perpendicular to axis AX3. Specifically, beams 122a and 122b are opposite to each other with respect to plummet 121 on support axis AX41, extend along support axis AX41 in directions opposite to each other, and are connected to support part 123 having a frame shape as to movably support plummet 121 with respect to support part 123 in internal space 126. Axis AX3 and axis AX4 are perpendicular to each other, and extend in parallel with surface 1121 of plummet 121.

Axis AX5 perpendicular to axis AX1 and axis AX2 is defined. Axis AX6 perpendicular to axis AX3 and axis AX4 is defined.

In sensor 100 according to Embodiment 2, sensor elements 101 and 102 are disposed such that axis AX5 is perpendicular to axis AX6.

An operation of sensor 100 according to Embodiment 2 will be described below.

Figure 13:
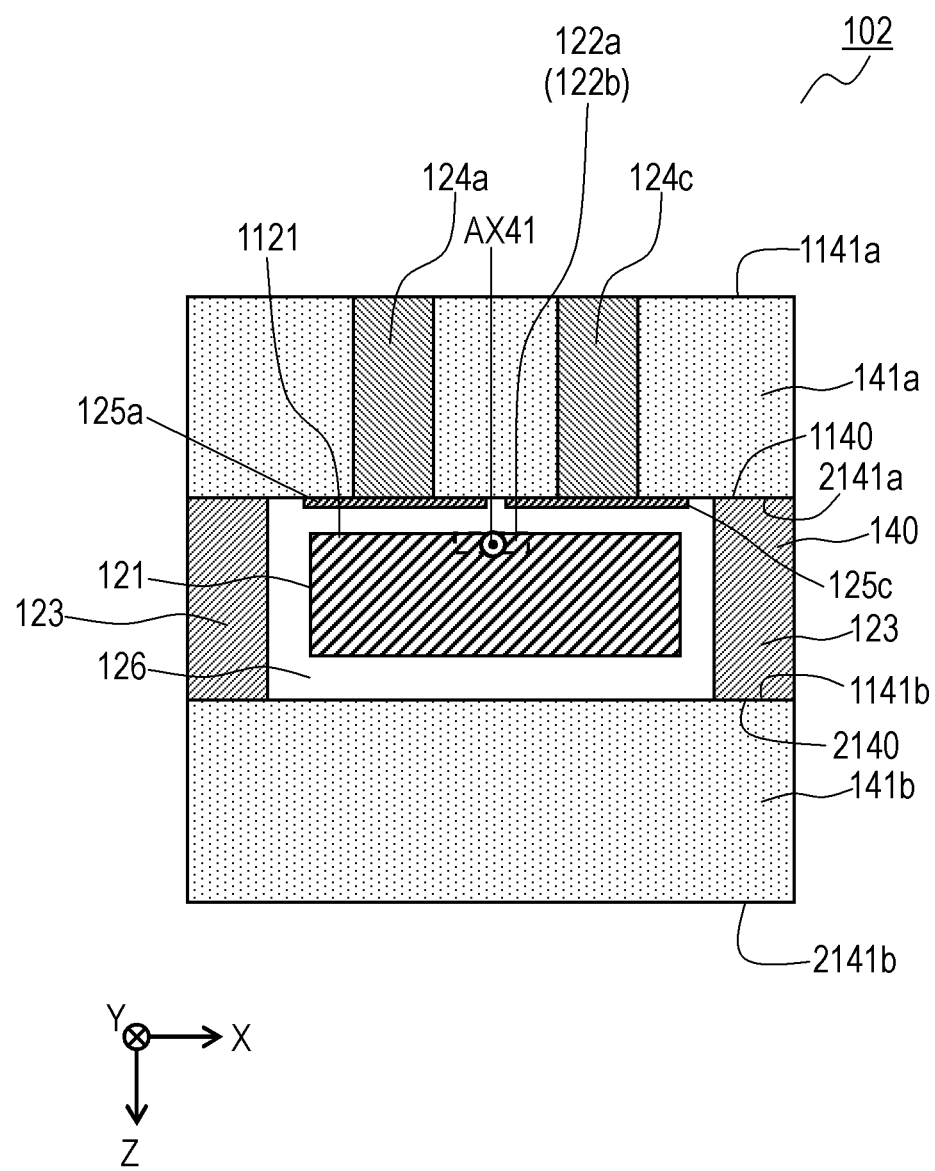
FIG. 13 is a cross-sectional view of the sensor element of the sensor according to Embodiment 2 while an acceleration in a direction of an X-axis is not applied to the sensor element.
Figure 14:
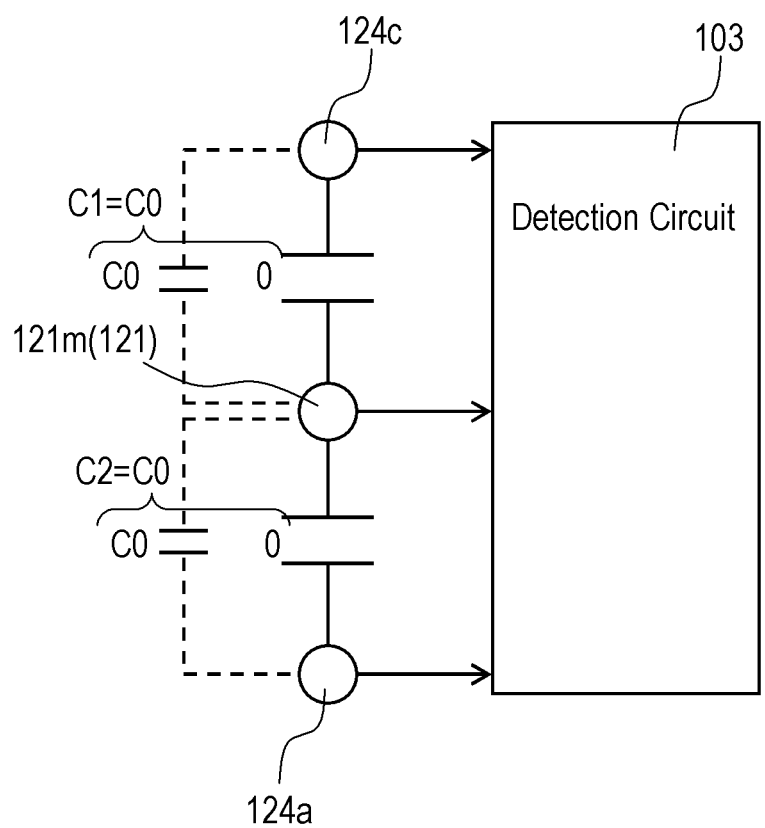
FIG. 14 is an equivalent circuit diagram of the sensor according to Embodiment 2 for illustrating an operation of the sensor detecting an acceleration in the direction of the X-axis.

FIG. 13 is a cross-sectional view of sensor element 102 along line 13-13 illustrated in FIG. 12 in which an acceleration in a direction along the X-axis is not applied to sensor element 102. FIG. 14 is an equivalent circuit diagram of sensor 100 for illustrating an operation of sensor 100 detecting an acceleration in a direction along the X-axis. While an acceleration in the direction along the X-axis is not applied, as illustrated in FIG. 14, capacitance C1 between plummet 121 and fixed electrode 125a and capacitance C2 between plummet 121 and fixed electrode 125c are equal to parasitic capacitance C0. Detection circuit 103 calculates a difference value (C1−C2=C0−C0=0) between capacitances C1 and C2, and outputs the difference value as an X output.

Figure 15:
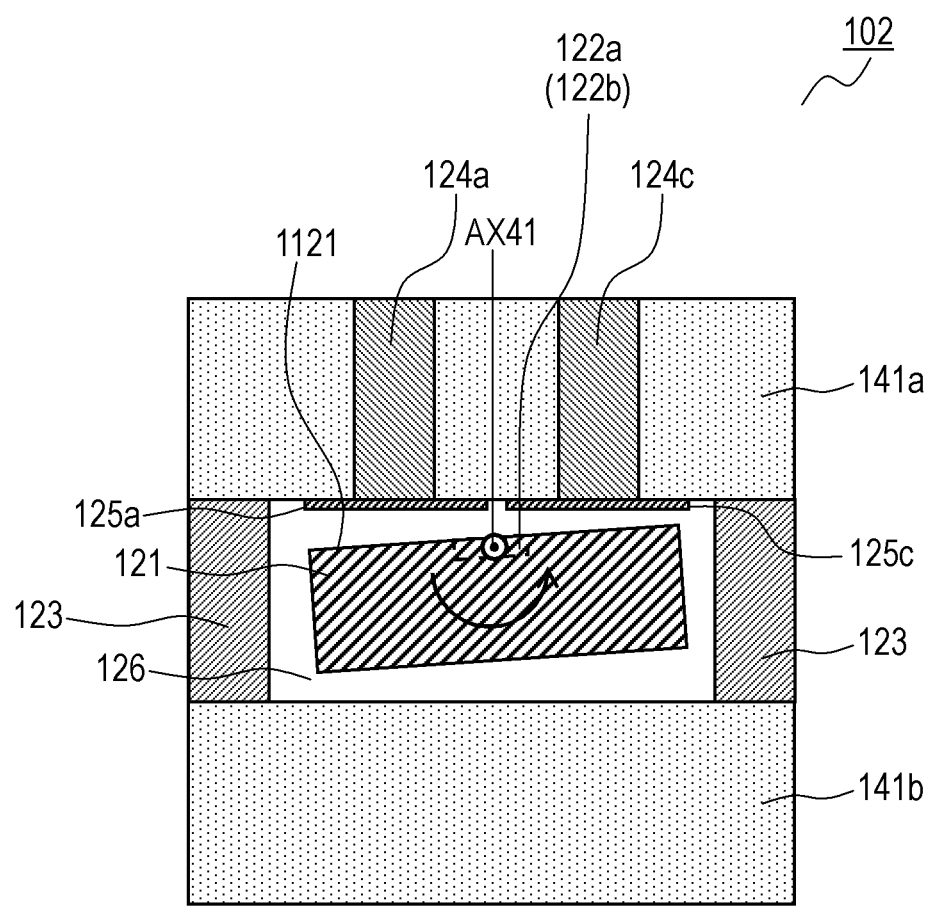
FIG. 15 is a cross-sectional view of the sensor element of the sensor according to Embodiment 2 while an acceleration of 1G in the direction of the X-axis is applied to the sensor.
Figure 16:
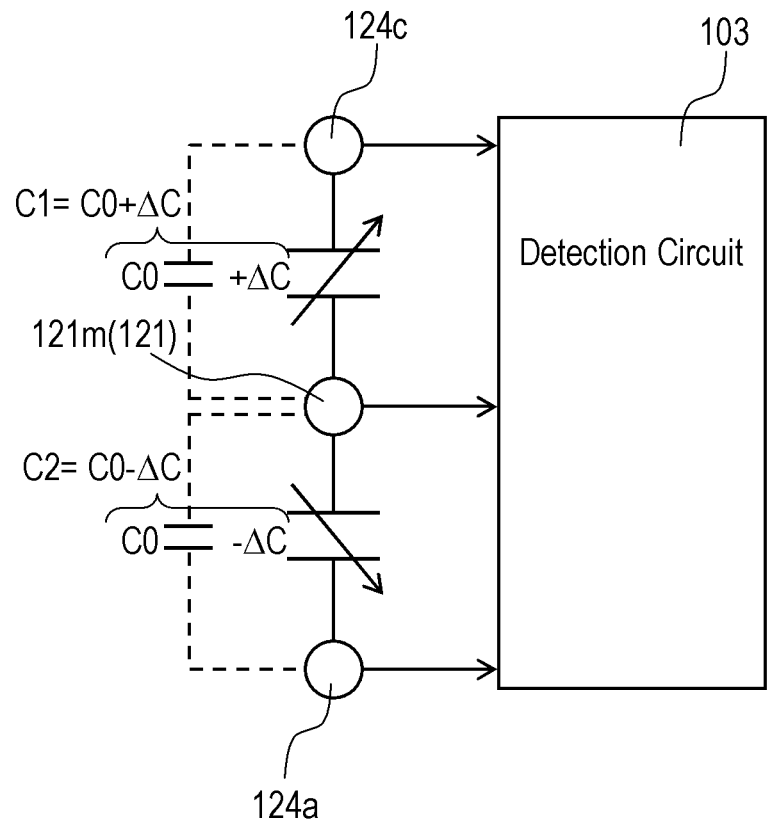
FIG. 16 is an equivalent circuit diagram of the sensor according to Embodiment 2 for illustrating an operation of the sensor detecting the acceleration in the direction of the X-axis.

FIG. 15 is a cross-sectional view of sensor element 102 while an acceleration of 1G is applied to sensor element 102 in a direction along the X-axis. FIG. 16 is an equivalent circuit diagram of sensor 100 while where an acceleration of 1G is applied to sensor element 102 in the direction along the X-axis.

While an acceleration of 1G is applied in the X-axis direction, as illustrated in FIG. 15, plummet 121 rotates about beams 122a and 122b, i.e., about support axis AX41. As illustrated in FIG. 16, capacitance C1 between plummet 121 and fixed electrode 125a is capacitance (C0+ΔC) that is the sum of parasitic capacitance C0 and sensitivity capacitance ΔC while capacitance C2 between plummet 121 and fixed electrode 125c is capacitance (C0−ΔC) that is the sum of parasitic capacitance C0 and sensitivity capacitance −ΔC. Detection circuit 103 calculates a difference value (C1−C2=2·ΔC) between capacitances C1 and C2, and outputs the difference value as an X output.

Sensor element 102 thus detects an acceleration in a direction along the X-axis based on a change in the capacitances. Sensor element 101 detects an acceleration in a direction along a Z-axis similarly to sensor element 102 except for the location from which an electrode extends.

In sensor elements 101 and 102, plummets 111 and 121 rotate about support axes AX21 and AX41, respectively, due to accelerations along axes other than an axis to be detected. Thus, detection circuit 103 corrects an output of sensor element 102 due to an acceleration in a direction along the Z-axis based on a detection result of an acceleration in the direction along the Z-axis by sensor element 101, and corrects an output of sensor element 101 due to an acceleration in a direction along the X-axis based on a detection result of an acceleration in a direction along the X-axis by sensor element 102.

In the conventional sensor disclosed in PTL 3, all of the X-axis, the Y-axis, and the Z-axis are located on the same plane. Thus, to correct an output due to an acceleration along axes other than a detection axis, three axes of the X-axis, the Y-axis, and the Z-axis are required to detect, hence increasing the size of the sensor.

Sensor 100 according to Embodiment 2 provides the following advantages (1) to (4):

(1) In detecting of acceleration along the X-axis and the Z-axis, sensitivity to accelerations along other axes is reduced.

(2) Errors in mounting sensor elements 101 and 102 are reduced.

(3) Connection between sensor elements 101 and 102 and detection circuit 103 is simplified.

(4) An output during no acceleration is applied is stabilized.

Advantage (1) will be detail below. Sensor elements 101 and 102 are disposed such that support axis AX21 on which beams 112a and 112b of sensor element 101 are disposed is parallel with support axis AX41 (axis AX4) on which beams 122a and 122b of sensor element 102 on a projection plane of sensor 100 from above, that is, in a plan view from above. In such an arrangement, plummet 111 of sensor element 101 easily rotates about support axis AX21 due to an acceleration in a direction along the X-axis, but is hardly displaced due to an acceleration in a direction along the Y-axis. On the other hand, plummet 121 of sensor element 102 easily rotates about support axis AX41 due to an acceleration in a direction along the Z-axis, but is hardly displaced due to an acceleration in a direction along the Y-axis. Sensor element 101 is used for detecting an acceleration in a direction along the Z-axis while sensor element 102 is used for detecting an acceleration in a direction along the X-axis. Thus, correction can be performed based on results of the detections. Since plummets 111 and 121 are hardly displaced due to an acceleration in a direction along the Y-axis, sensor 100 detects accelerations along two axes (X-axis and Z-axis) while reducing sensitivity to an acceleration along the other axis (Y-axis).

Advantage (2) will be detailed below. Since axis AX5 in sensor element 101 is perpendicular to axis AX6 in sensor element 102, sensor elements 101 and 102 have completely different shapes (appearances) viewing from above (see FIG. 10B). As a result, while mounting sensor elements 101 and 102 onto package substrate 104, a mix-up between sensor elements 101 and 102 can be prevented.

Advantage (3) will be detailed below. The height of side surface 3130 of sensor element 101 is substantially equal to the height of surface 1141a of sensor element 102. As a result, conditions for connection between detection circuit 103 and each of sensor elements 101 and 102 are not required to adjust in the case of connection using wire bonding, for example, and connection can be easily performed.

The height of side surface 3130 of sensor element 101 is preferably equal to the height of surface 1141a of sensor element 102 by adjusting the thicknesses of substrates 131b and 141b. Reduction of the thicknesses of substrate 131a and substrate 141a allows the via-conductors to be easily formed.

Advantages (4) will be detailed below. Plummet 111 and beams 112a and 112b of sensor element 101 have the same structures as those of plummet 121 and beams 122a and 122*b* of sensor element 102. The sensor elements 101 and 121 are mounted while being rotated by 90 degrees from each other so that accelerations in directions along different axes, that is, the X-axis and the Y-axis, are detected. In each of sensor element 101 and sensor element 102, since fixed electrodes are provided only on one surface (surface 2131*a* of substrate 131*a* and surface 2141*a* of substrate 141*a* shown in FIGS. 11 and 12), even when a gap between surface 1111 of plummet 111 and each of fixed electrodes 115*a* and 115*c* and a gap between surface 1121 of plummet 121 and each of fixed electrodes 125*a* and 125*c* change, these changes are canceled and do not influence on signals output from the electrodes. Thus, sensor 100 that detects an acceleration in a direction along the Z-axis and an acceleration in a direction perpendicular to the Z-axis can stabilize an output obtained when no acceleration is applied.

In the above description, substrate 131*a* of sensor element 101 and substrate 141*a* of sensor element 102 have different structures, but may have the same structure. In this case, similar advantages can be obtained. Via-conductors 114*a* and 114*c* are preferably symmetrical to each other with respect to plummet 111 while via-conductors 124*a*, 124*b*, 124*c*, and 124*d* are symmetrical to one another with respect to plummet 121. This arrangement equalizes changes of the gaps described above even when expansion or contraction occurs due to a change of temperature.

Figure 17:
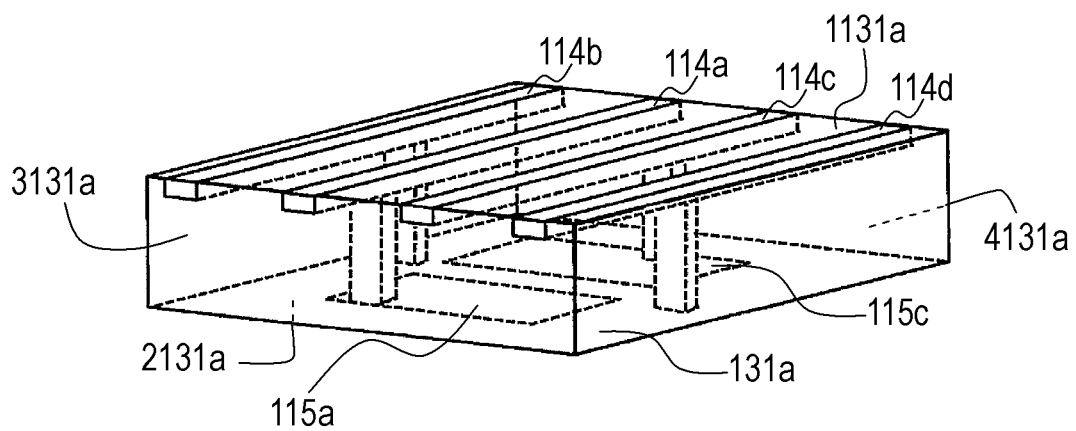
FIG. 17 is a perspective view of another substrate of the sensor element according to Embodiment 2.

FIG. 17 is a perspective view of another substrate 131*a* of sensor element 101. In FIG. 17, components identical to those of substrate 131*a* illustrated in FIG. 11 are denoted by the same reference numerals. In substrate 131*a* illustrated in FIG. 11, via-conductors 114*a* and 114*c* are connected to fixed electrodes 115*a* and 115*c*, respectively. Substrate 131*a* illustrated in FIG. 17 further includes via-conductors 114*b* and 114*d* provided on surface 1131*a*. Via-conductors 114*b* and 114*d* are connected to common electrode 111*m* (plummet 111) to extract electrical signals.

In substrate 131*a* illustrated in FIG. 17, via-conductors 114*a*, 114*b*, 114*c*, and 114*d* allow via-conductors 114*b* and 114*d* to be disposed symmetrically to each other with respect to plummet 111 in a projection plane from above, that is, in a plan view from above. A change of each of gaps between plummet 111 (common electrode 111*m*) and respective one of fixed electrodes 115*a* and 115*b* caused by a temperature change due to a difference among in linear expansion coefficients of substrates 130, 131*a*, and 131*b*, that is, changes in capacitances C1 and C2, can be equal to one another. Thus, sensor element 101 can operate stably with respect to temperature.

Figure 18A:
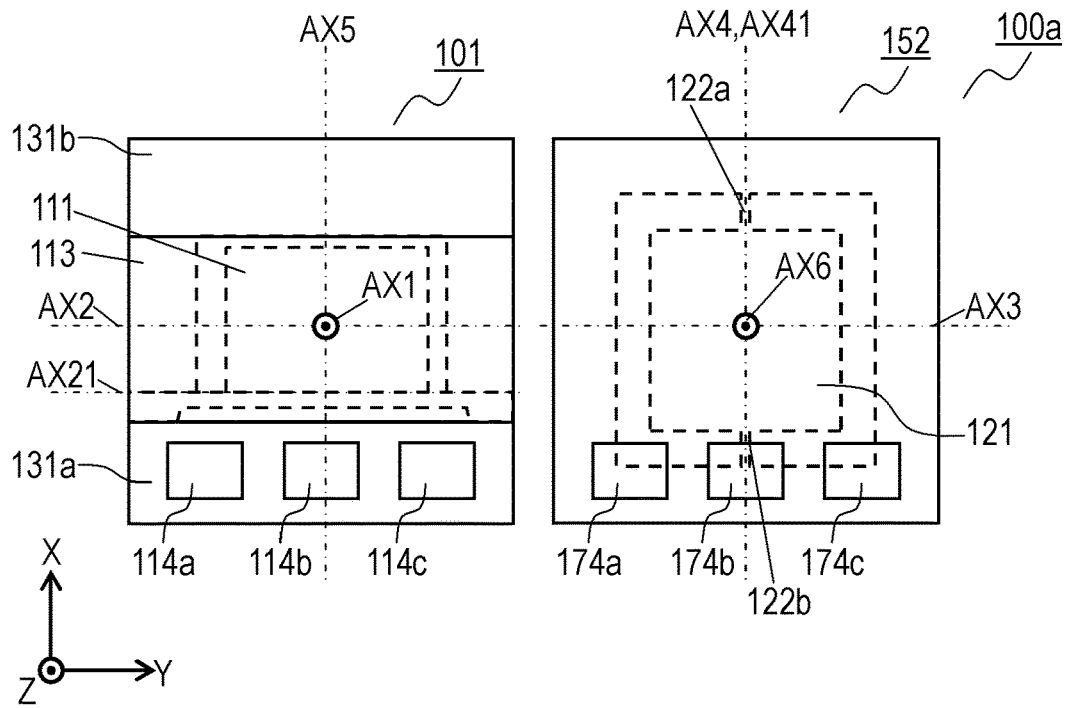
FIG. 18A is a top view of a sensor element of another sensor according to Embodiment 2.
Figure 18B:
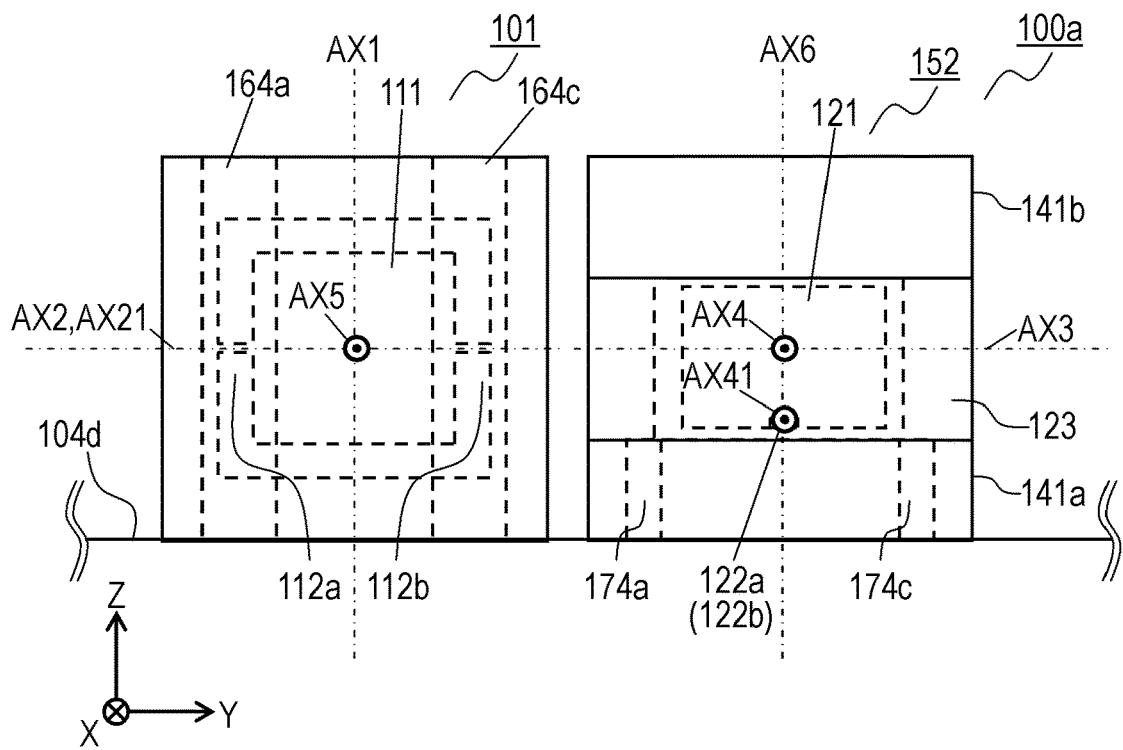
FIG. 18B is a cross-sectional view of the sensor element of the sensor illustrated in FIG. 18A.

FIGS. 18A and 18B are a top view and a cross-sectional view of another sensor 100*a* according to Embodiment 2, respectively. In FIGS. 18A and 18B, components identical to those of sensor 100 illustrated in FIGS. 7A to 16 are denoted by the same reference numerals. FIGS. 18A and 18B illustrate cross sections of sensor 100*a* viewing from the same positions as FIGS. 10A and 10B, respectively. Sensor 100*a* illustrated in FIGS. 18A and 18B includes sensor element 152 instead of sensor element 102.

Sensor 100 according to Embodiment 2 detects accelerations in directions along two axes, that is, the X-axis and the Z-axis. Sensor 100*a* illustrated in FIGS. 18A and 18B detects accelerations in directions of two axes, that is, the Y-axis and the Z-axis. Sensor element 152 has the same configuration as sensor element 102 of sensor 100 illustrated in FIGS. 7A to 16 including substrates 130, 131*a*, and 131*b*. Sensor element 152 includes via-conductors 174*a* and 174*b* connected to fixed electrodes 125*a* and 125*b* and via-conductor 174*c* connected to common electrode 121*m*, similarly to via-conductors 124*a* and 124*b* and via-conductor 124*c* of sensor element 102. A pair of beams 112*a* and 112*b* is disposed on support axis AX41. Axis AX5 is parallel to surface 1121 of plummet 121, and is perpendicular to axis AX4 (support axis AX41). Axis AX3 of sensor element 102 is parallel to axis AX2 and support axis AX21 of sensor element 101. Axis AX6 of sensor element 152 is perpendicular to axis AX5 of sensor element 101, and axes AX5 and AX6 extend in different directions. Axis AX4 of sensor element 152 extends in a direction along the X-axis. Sensor element 152 detects an acceleration in a direction along the Y-axis. Since sensor element 101 detects an acceleration in a direction along the Z-axis, sensor 100*a* can detect accelerations in directions along two axes, that is, the Y-axis and the Z-axis. Sensor 100*a* illustrated in FIGS. 18A and 18B can provide advantages (2) to (4).

Exemplary Embodiment 3

Figure 19A:
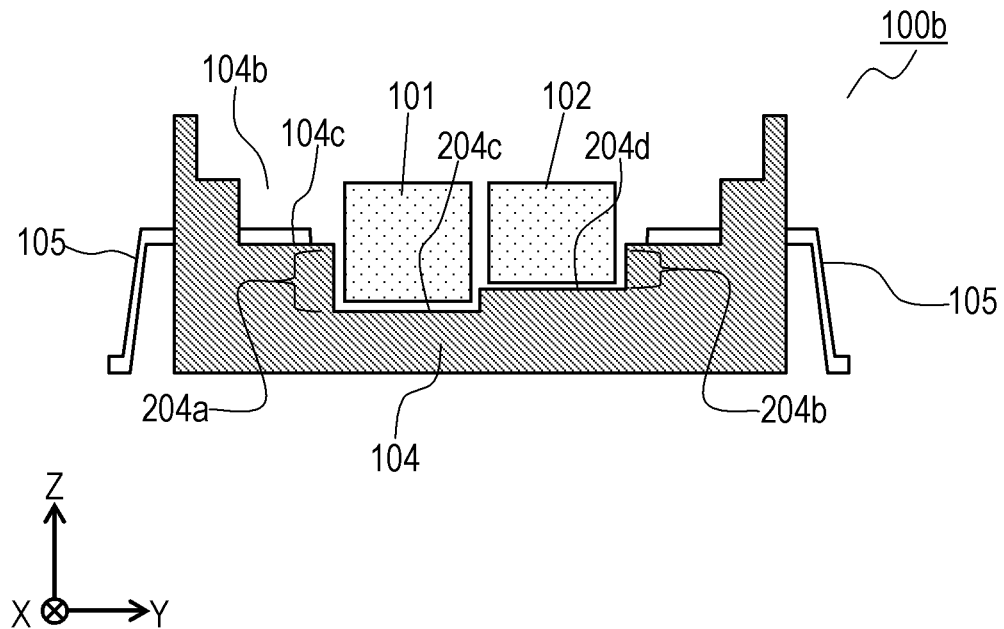
FIG. 19A is a cross-sectional view of a sensor according to Exemplary Embodiment 3.
Figure 19B:
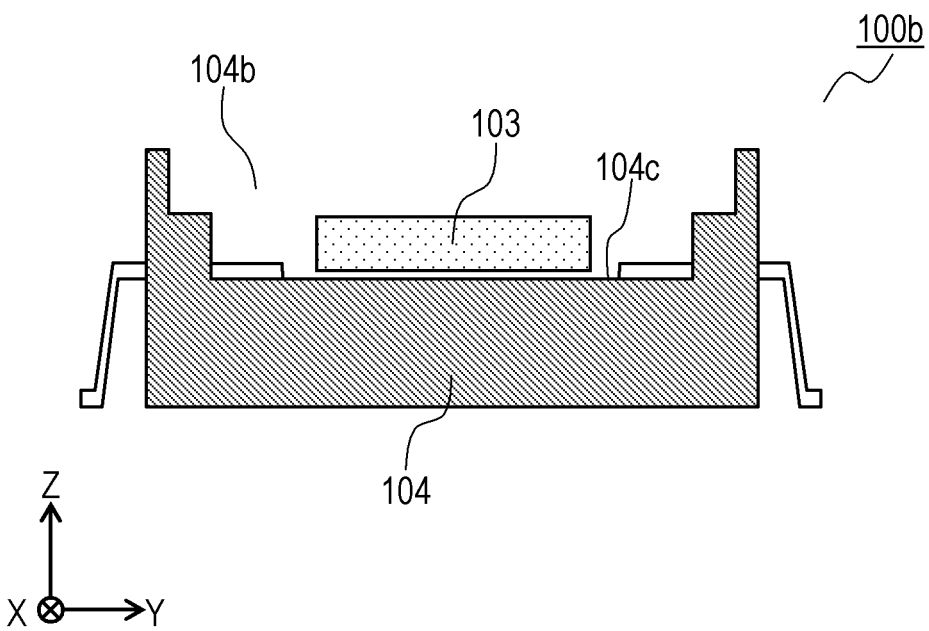
FIG. 19B is a cross-sectional view of the sensor according to Embodiment 3.

FIGS. 19A and 19B are cross-sectional views of sensor 100*b* according to Exemplary Embodiment 3. In FIGS. 19A and 19B, components identical to those of sensor 100 according to Embodiment 2 illustrated in FIGS. 9A and 9B are denoted by the same reference numerals. Sensor 100*b* has substantially the same appearance as sensor 100 according to Embodiment 2. FIGS. 19A and 19B illustrate cross sections of sensor 100*b* viewing from the same positions as FIGS. 9A and 9B, respectively.

Figure 20A:
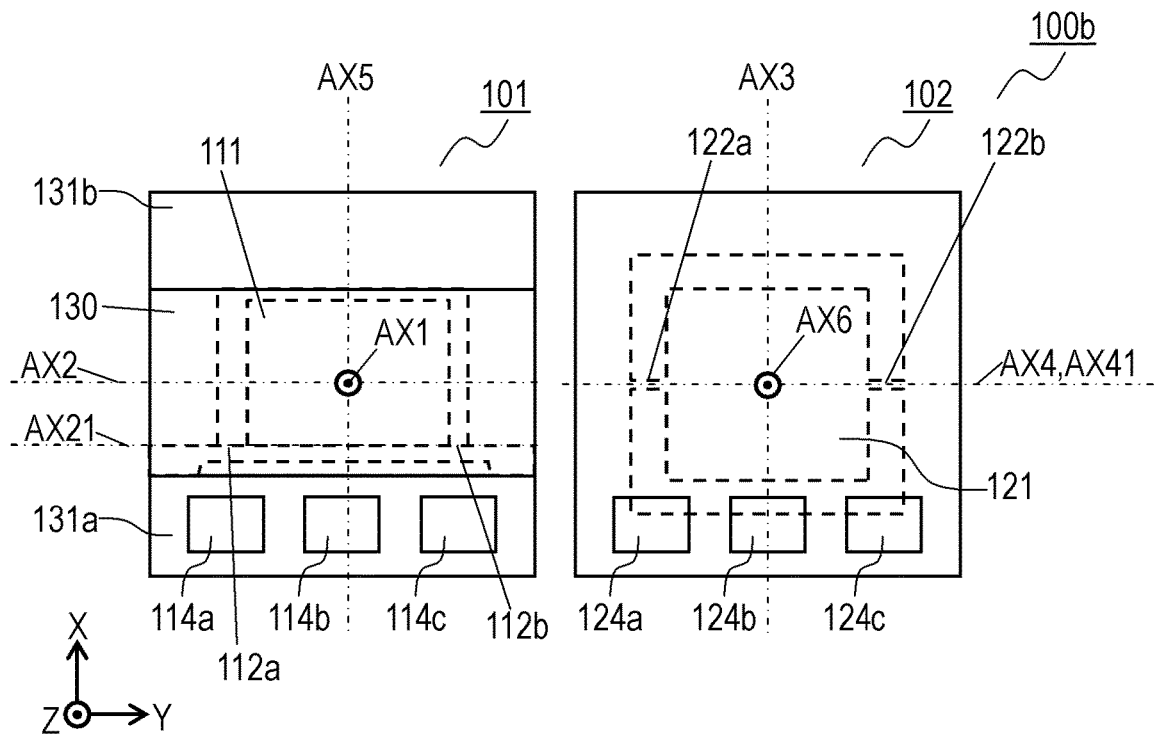
FIG. 20A is a top view of a sensor element of the sensor according to Embodiment 3.
Figure 20B:
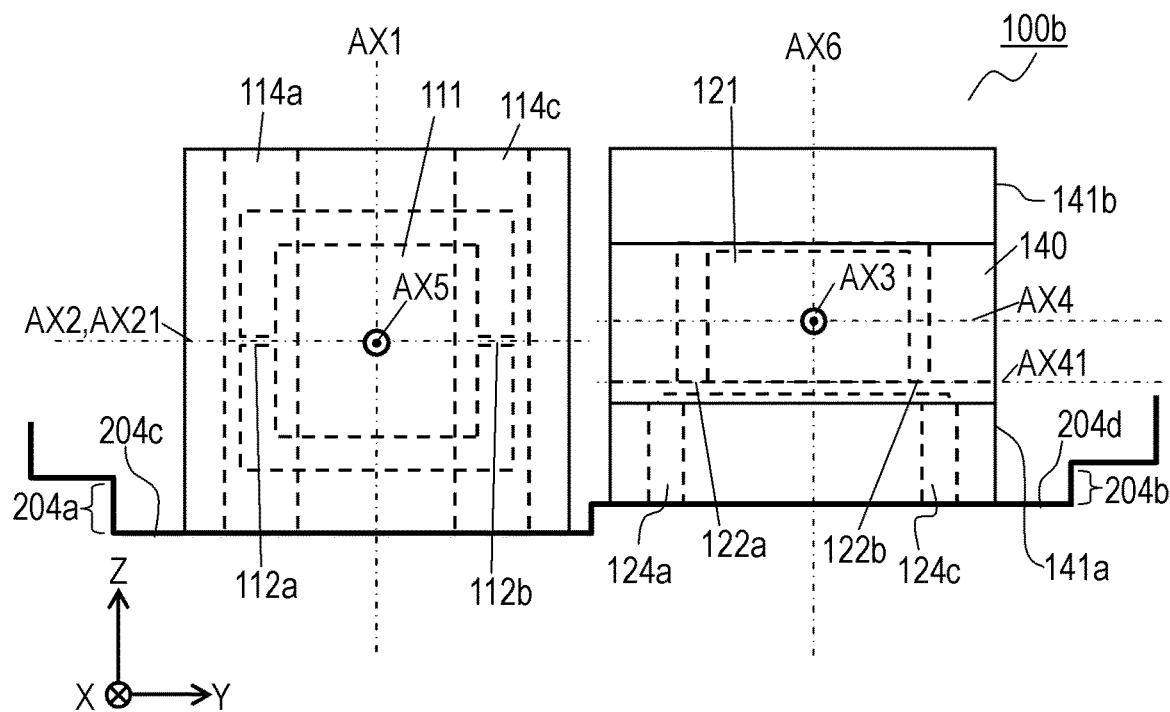
FIG. 20B is a cross-sectional view of the sensor element illustrated in FIG. 20A.

FIG. 20A is a top view of sensor 100*b*. FIG. 20B is a cross-sectional view of sensor 100*b*. FIGS. 20A and 20B illustrate cross sections of sensor 100*b* viewing from the same positions as FIGS. 10A and 10B, respectively.

Bottom surface 104*c* of internal space 104*b* in package substrate 104 of sensor 100*b* has recesses 204*a* and 204*b* having different depths provided therein. Recesses 204*a* and 204*b* have bottom surfaces 204*c* and 204*d* having different depths. In accordance with Embodiment 3, recesses 204*a* and 204*b* are connected to each other. Sensor elements 101 and 102 are disposed side by side in recesses 204*a* and 204*b*, respectively, so that sensor elements 101 and 102 are placed on bottom surfaces 204*c* and 204*d* of recesses 204*a* and 204*b* of package substrate 104.

In sensor 100*b* according to Embodiment 3, sensor elements 101 and 102 have different thicknesses in a direction along the Z-axis, as illustrated in FIGS. 19A and 20B. The depths of recesses 204*a* and 204*b* in package substrate 104 are determined in accordance with the thicknesses of sensor elements 101 and 102. In accordance with Embodiment 3, the thickness of sensor element 101 along in a direction along the Z-axis is larger than the thickness of sensor element 102 in a direction along the Z-axis. The depth of recess 204*b* is smaller than the depth of recess 204*a*.

Recesses 204*a* and 204*b* allows the height from the lowest part of the bottom surface of the package substrate 104 (i.e., bottom surface 204*c* of recess 204*a*) to the upper surface of sensor element 101 to be substantially equal to the height from this lowest part to the upper surface of sensor element 102. This configuration allows sensor 100*b* to have plummets 111 and 121 stable with respect to temperature.

In sensor 100*b*, axis AX2 and axis AX4 are positioned at different heights. Axis AX2 passes substantially through the center (the center in cross section) of plummet 111 while axis AX4 passes substantially through the center (the center in cross section) of plummet 121.

This configuration provides advantage (5) described below in addition to advantages (1) to (4) described above.

(5) Characteristics of sensor elements 101 and 102 can be adjusted independently of each other.

Advantage (5) will be detail below. Sensor elements 101 and 102 are disposed in package substrate 104 in orientations different from each other by 90 degrees. As illustrated in FIGS. 11 and 12, substrates 131a and 141a have different structures. To optimize a change in a gap between the plummet and the fixed electrode due to a temperature change of sensor elements 101 and 102, it is necessary to change the thicknesses of substrates 131b and 141b. Package substrate 104 according to Embodiment 3 enables characteristics of sensor elements 101 and 102 to be adjusted independently of each other in addition to the advantage of simple connection to detection circuit 103.

In accordance with Embodiment 3, recesses 204a and 204b of package substrate 104 have different depths. Recesses 204a and 204b may have the same depth while sensor elements 101 and 102 may different thicknesses, hence providing the same effects. In this case, package substrate 104 can be easily fabricated, and a variation in forming package substrate 104 less affects characteristics.

Exemplary Embodiment 4

Figure 21:
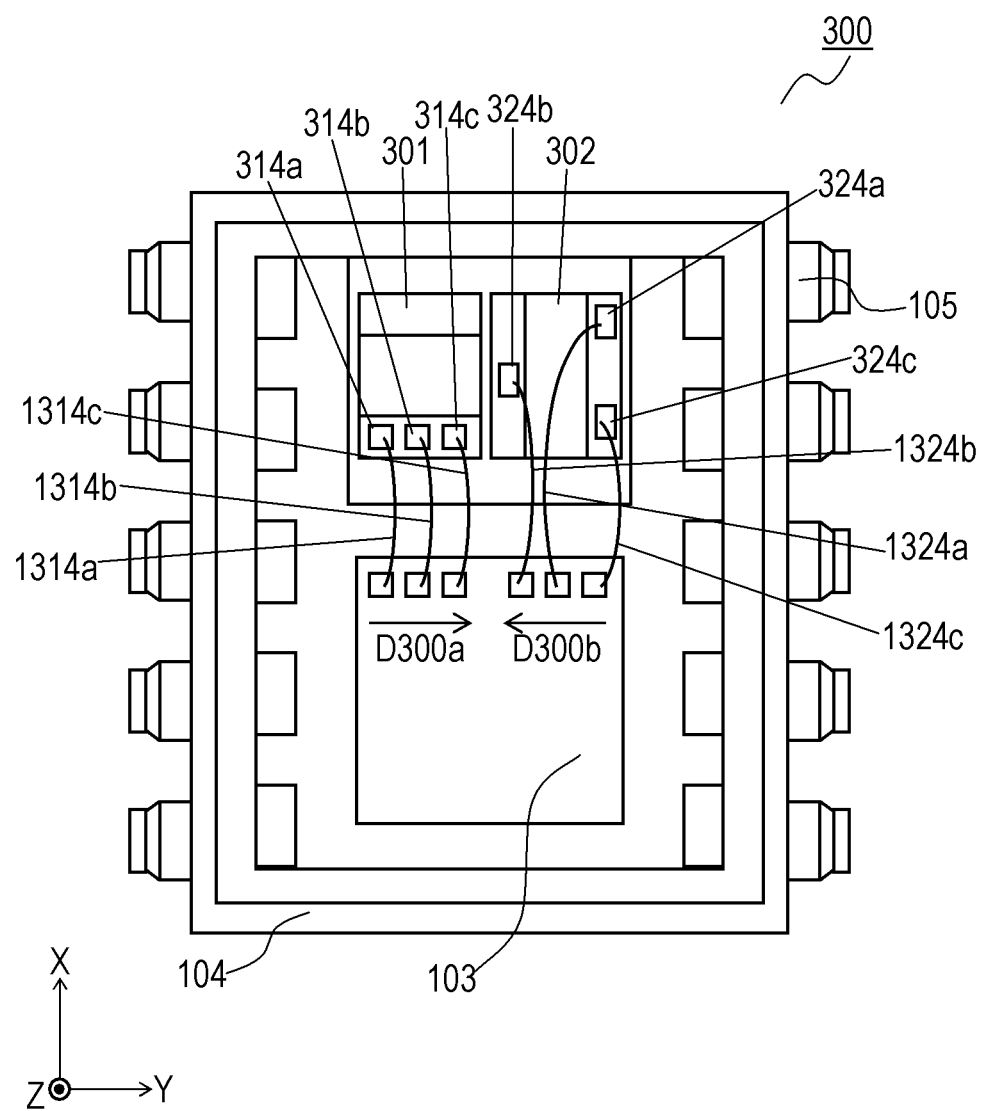
FIG. 21 is a top view of a package substrate of a sensor according to Exemplary Embodiment 4 for illustrating an inside of the package substrate.
Figure 22:
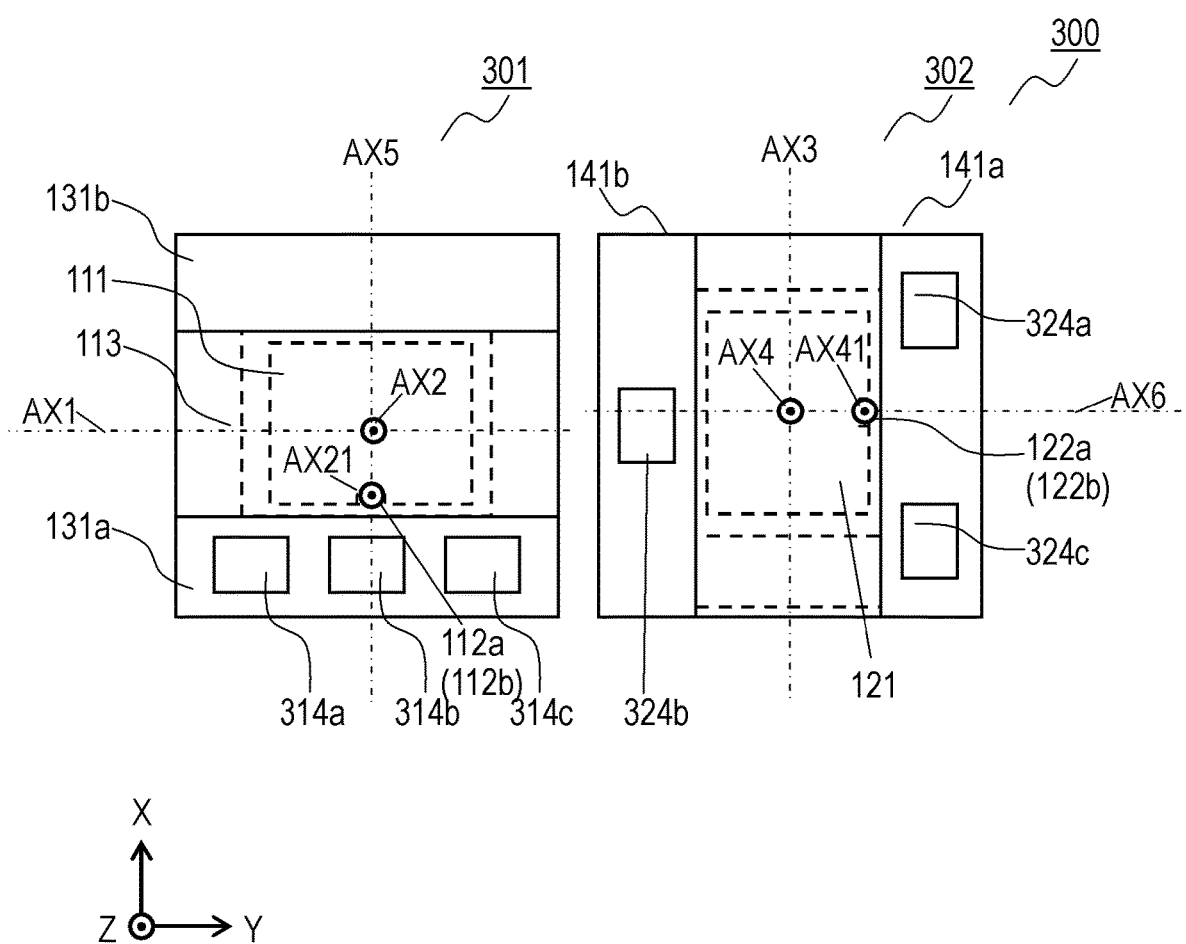
FIG. 22 is a top view of a sensor element of the sensor according to Embodiment 4.

FIG. 21 is a top view of package substrate 104 of sensor 300 according to Exemplary Embodiment 4 for illustrating an internal configuration of package substrate 104. FIG. 22 is a top view of sensor elements 301 and 302 of sensor 300. In FIGS. 21 and 22, components identical to those of sensor 100 according to Embodiment 2 illustrated in FIGS. 7A to 16 are denoted by the same reference numerals.

Sensor element 301 includes substrates 130, 131a, and 131b of sensor 101 according to Embodiment 2 stacked on one another and via-conductors 314a, 314b, and 314c connected to fixed electrodes 115a and 115c and common electrode 111m (plummet 111). Sensor element 302 includes substrates 140, 141a, and 141b of sensor 102 according to Embodiment 2 stacked on one another and via-conductors 324a, 324b, and 324c connected to fixed electrodes 125a and 125c and common electrode 121m (plummet 121).

Via-conductors 314a, 314b, 314c, 324a, 324b, and 324c are arranged at locations to be easily connected to detection circuit 103. Via-conductors 314a, 314b, and 314c are arranged in parallel with detection circuit 103.

Via-conductors 324a and 324c are disposed side by side on substrate 141a while via-conductor 324b is disposed on substrate 141b.

Via-conductors 314a, 314b, 314c, 324a, 324b, and 324c are connected to detection circuit 103 with conductive wires 1314a, 1314b, 1314c, 1324a, 1324b, and 1324c made of metal, respectively.

Conductive wires 1314a, 1314b, 1314c, 1324a, 1324b, and 1324c are substantially parallel to one another in a top view, that is, in a plan view from above.

Conductive wires 1314a, 1314b, 1314c, 1324a, 1324b, and 1324c have arcuate shapes in a top view, that is, in a plan view.

Conductive wire 1324b connecting via-conductor 324b to detection circuit 103 extends substantially in parallel to conductive wire 1324c connecting via-conductor 324c to detection circuit 103 in a top view, that is, in a plan view from above.

Conductive wires 1324b and 1324c have arcuate shapes protruding in direction D300a in a top view, that is, in a plan view from above. Conductive wire 1324a has an arcuate shape protruding in direction D300b opposite to direction D300a in a top view, that is, in a plan view from above. In other words, the distance between conductive wire 1324a and conductive wire 1324b is smaller than the distance between conductive wire 1324a and conductive wire 1324c. In other words, conductive wires 1324a and 1324c have arcuate shapes protruding in directions opposite to each other in a top view, that is, in a plan view from above.

Sensor 300 according to Embodiment 4 is different from the sensors according to Embodiments 1 and 2 in that sensor elements 301 and 302 have an identical shape and sensor elements 301 and 302 are disposed in package substrate 104 while being rotated by 90 degrees from each other.

Other parts of the configuration and operation, for example, of sensor 300 are similar to those of the other embodiments.

This configuration described above provides an advantage below in addition to advantages (2), (3), and (4).

(6) In detection along the X-axis and the Y-axis, sensitivity along the other axes can be reduced.

Advantage (6) will be detailed below. Since sensor element 301 and sensor element 302 are disposed in package substrate 104 while being rotated different from each other by 90 degrees, sensor elements 301 and 302 are disposed such that axis AX2 (support axis AX21) of sensor element 301 is parallel to axis AX4 (support axis AX41) of sensor element 302 in a top view of sensor 300, that is, in a plan view from above. In this arrangement, in sensor element 301, plummet 111 easily rotates about support axis AX21 due to an acceleration in a direction along the X-axis but is hardly displaced due to an acceleration in the Z-axis direction. On the other hand, in sensor element 302, plummet 121 easily rotates about support axis AX41 due to an acceleration in a direction along the Y-axis, but is hardly displaced due to an acceleration in a direction along the Z-axis. Since sensor element 301 is used for detecting an acceleration in a direction along the X-axis direction and sensor element 302 is used for detecting an acceleration in a direction along the Y-axis, an output of one sensor element can be corrected based on a detection result of the other sensor element. An acceleration in a direction along the Z-axis hardly displaces plummets 111 and 121 of sensor elements 301 and 302 structurally. Although detection is performed along two axes (X-axis and Y-axis), sensitivity along the other axis (Z-axis) can be easily reduced.

In addition, since sensor element 301 and sensor element 302 are different in the positions of via-conductors therein, an error in mounting sensor element 301 and sensor element 302 can be reduced.

Figure 23:
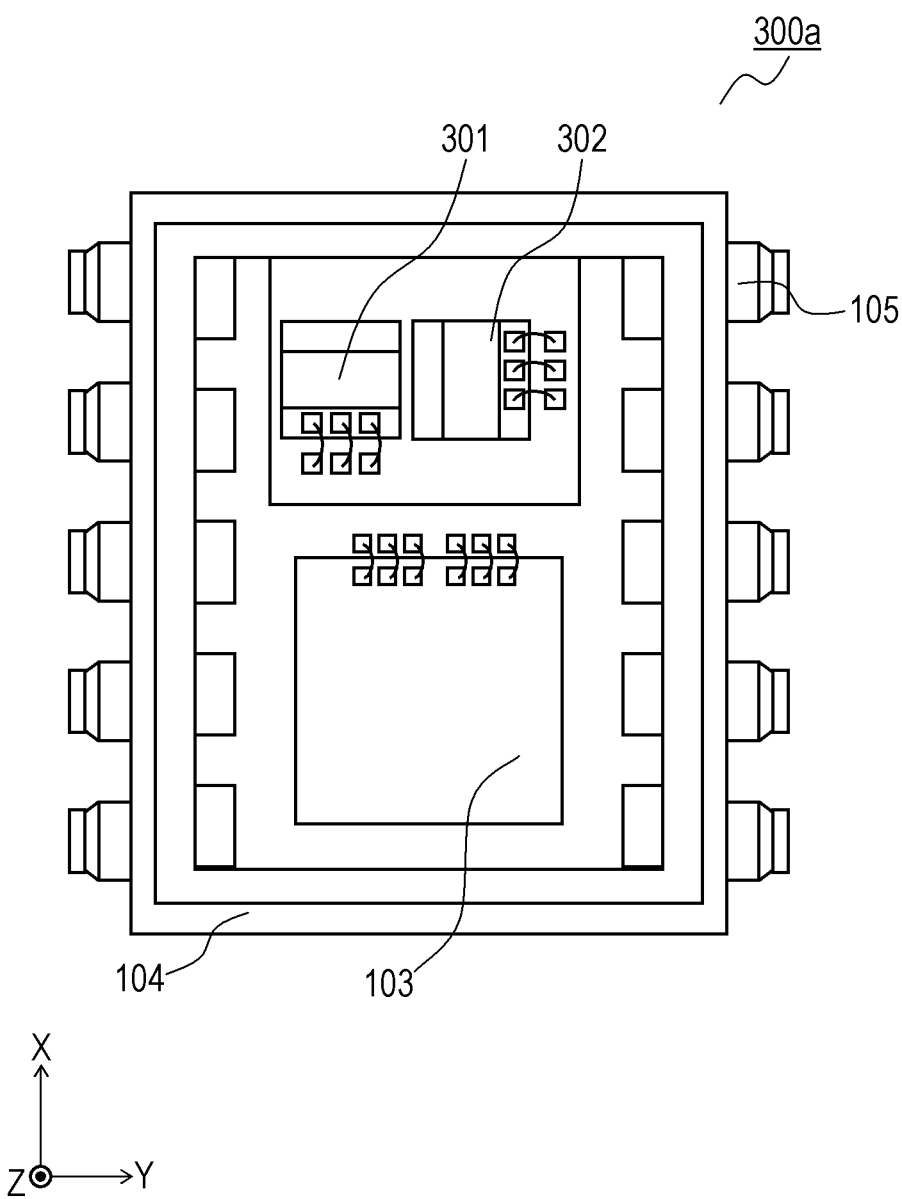
FIG. 23 is a top view of a package substrate of another sensor according to Embodiment 4 for illustrating an inside of the package substrate.
Figure 24:
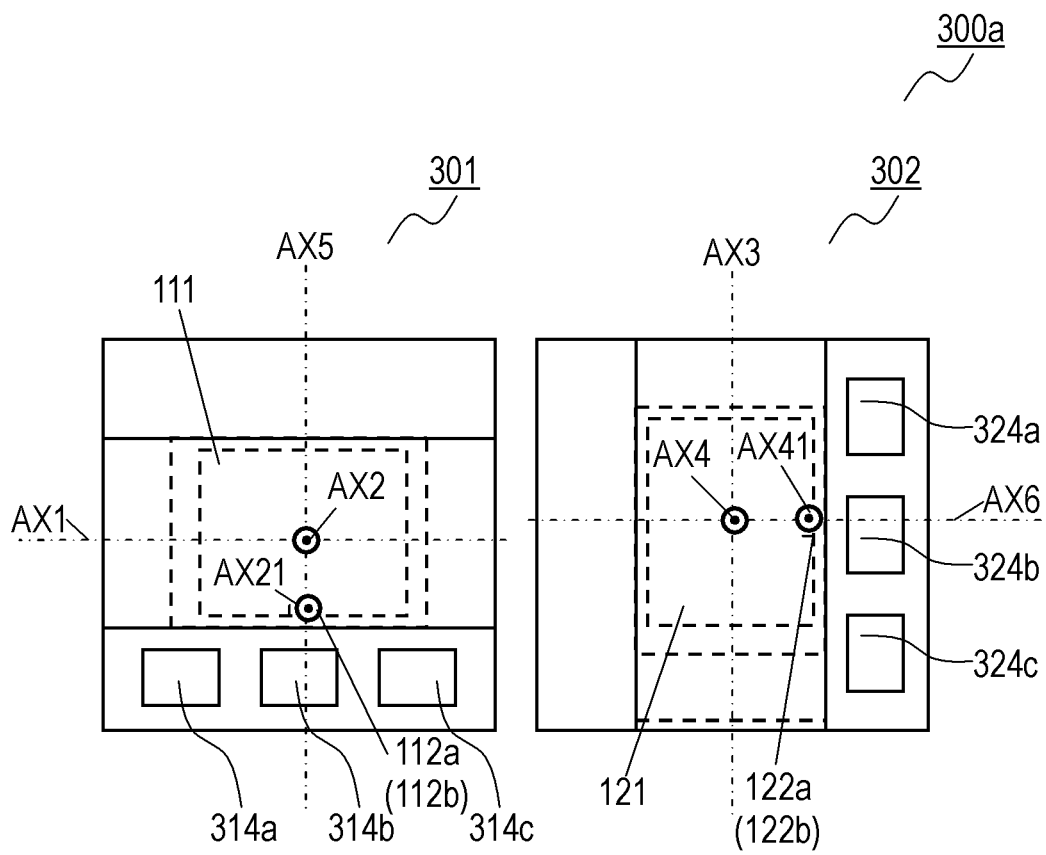
FIG. 24 is a top view of a sensor element of the sensor illustrated in FIG. 23.

FIG. 23 is a top view of package substrate 104 of another sensor 300a according to Embodiment 4 for illustrating an internal configuration of package substrate 104. FIG. 24 is a top view of sensor elements 301 and 302 of sensor 300a. In FIGS. 23 and 24, components identical to those of sensor 300 illustrated in FIGS. 21 and 22 are denoted by the same reference numerals. In sensor 300 illustrated in FIGS. 21 and 22, sensor element 301 and sensor element 302 are directly connected to detection circuit 103 through conductive wires. On the other hand, in sensor 300a illustrated in FIGS. 23 and 24, sensor elements 301 and 302 are connected to detection circuit 103 through package substrate 104. In this case, sensor element 301 and sensor element 302 have an identical configuration, and can be disposed while being rotated differently from each other by 90 degrees. Thus, fabrication thereof can be simplified.

Exemplary Embodiment 5

Figure 25:
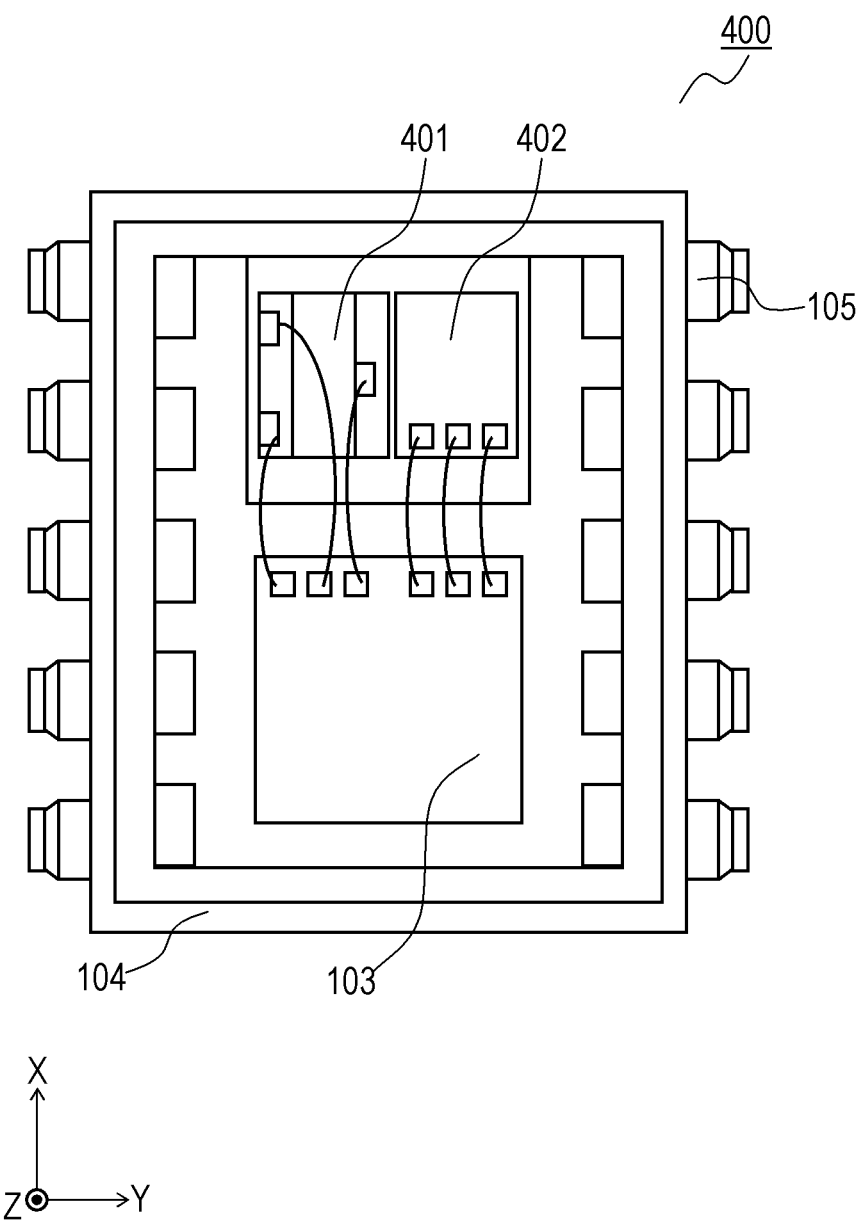
FIG. 25 is a top view of a package substrate of a sensor according to Exemplary Embodiment 5 for illustrating an inside of the package substrate.
Figure 26:
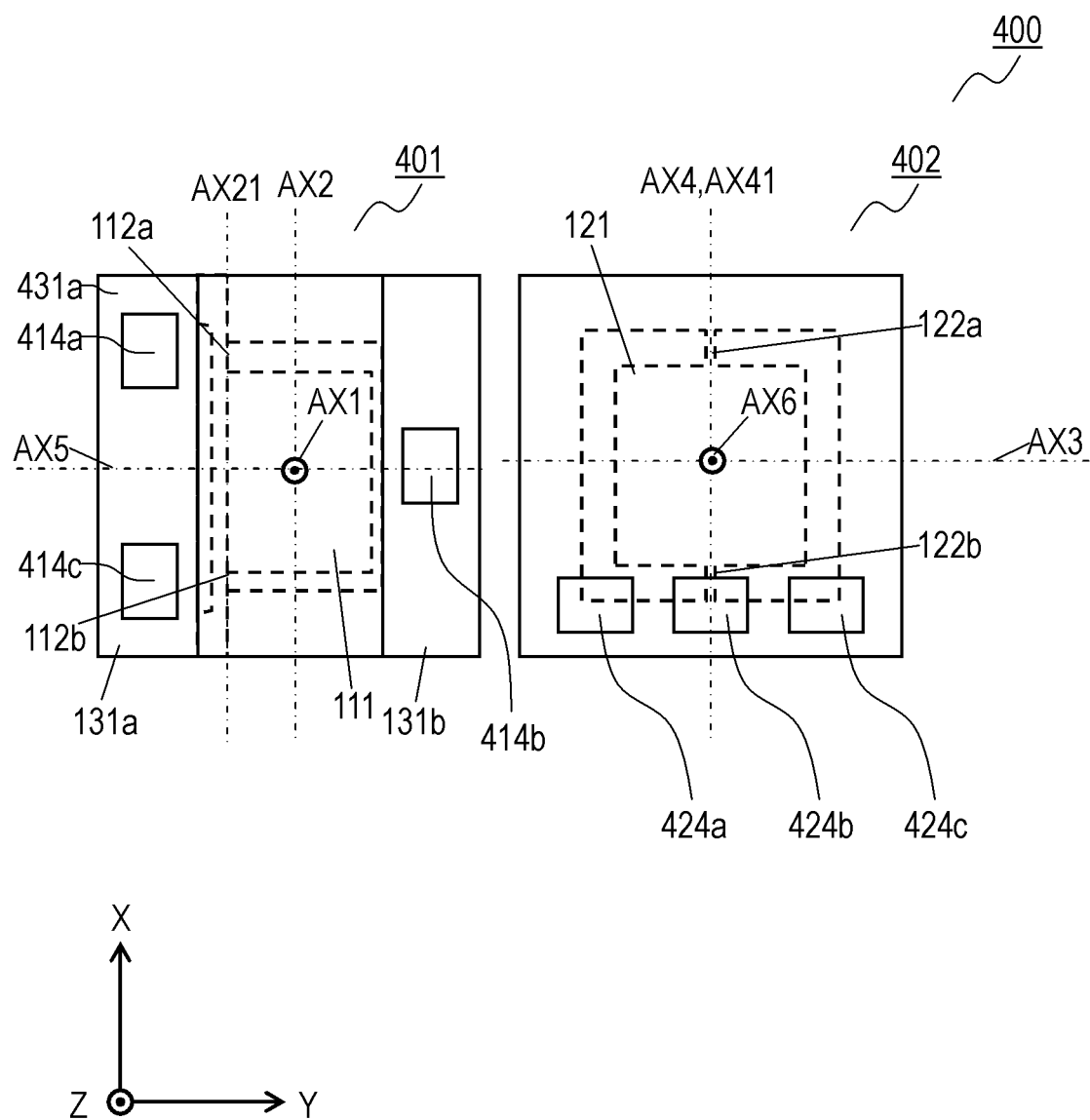
FIG. 26 is a top view of a sensor element of the sensor illustrated in FIG. 25.

FIG. 25 is a top view of package substrate 104 of sensor 400 according to Exemplary Embodiment 5 for illustrating an internal configuration of package substrate 104. FIG. 26 is a top view of sensor elements 401 and 402 of sensor 400. In FIGS. 25 and 26, components identical to those of sensor 100 according to Embodiment 2 illustrated in FIGS. 7A to 16 are denoted by the same reference numerals.

Sensor element 401 includes substrates 130, 131a, and 131b of sensor 101 according to Embodiment 2 stacked on one another and via-conductors 414a, 414b, and 414c connected to fixed electrodes 115a and 115c and common electrode 111m (plummet 111). Sensor element 402 includes substrates 140, 141a, and 141b of sensor 102 according to Embodiment 2 stacked on one another and via-conductors 424a, 424b, and 424c connected to fixed electrodes 125a and 125c and common electrode 121m (plummet 121).

Via-conductors 414a, 414b, 414c, 424a, 424b, and 424c are arranged at locations to be easily connected to detection circuit 103.

Via-conductors 414a, 414b, and 414c are arranged in parallel with detection circuit 103.

Via-conductors 424a and 424c are disposed side by side on substrate 141a. Via-conductor 424b is disposed on substrate 141b.

Sensor element 401 detects an acceleration in a direction along a Z-axis, and corresponds to sensor element 101 according to Embodiment 2. Sensor element 402 detects an acceleration in a direction along a Y-axis, and corresponds to sensor element 102 according to Embodiment 2. Unlike sensor 100 according to Embodiment 2, in sensor 400, support axis AX21 (axis AX2) along which beams 112a and 112b of sensor element 401 extend and support axis AX41 (axis AX4) along which beams 122a and 122b of sensor element 402 extend substantially coincide with a direction along an X-axis.

Other parts of the configuration and operation of sensor 400 are similar to those of sensors according to the other embodiments.

This configuration provides an advantage described below in addition to advantages (2), (3), and (4).

(7) In detection along the Y-axis and the Z-axis, sensitivity along the other axes can be reduced.

Advantage (7) will be detailed below. Sensor elements 401 and 402 are disposed in package substrate 104 such that axis AX2 and axis AX4 coincide with a direction along the X-axis. In this arrangement, in sensor element 401, plummet 111 easily rotates about support axis AX21 due to an acceleration in a direction along the Z-axis, but is hardly displaced due to an acceleration in a direction along the X-axis. On the other hand, in sensor element 302, plummet 121 rotates about AX41 due to an acceleration in a direction along the Y-axis, but is hardly displaced due to an acceleration in a direction along the X-axis. Since sensor element 401 is used for detecting an acceleration in a direction along the Z-axis and sensor element 402 is used for detecting an acceleration in a direction along the Y-axis, an output of one sensor element can be corrected based on a detection result of the other sensor element. An acceleration in a direction along the X-axis hardly displaces plummets 111 and 121 of sensor elements 401 and 402 structurally. Although detection is performed along two axes (Y-axis and Z-axis), sensitivity to the other axis (X-axis) can be easily reduced.

In addition, since sensor elements 401 and 402 are different from each other in configurations as illustrated in FIGS. 25 and 26 and in the positions of via-conductors, an error caused by mix-up between sensor elements 401 and 402 in assembly can be reduced.

Figure 27:
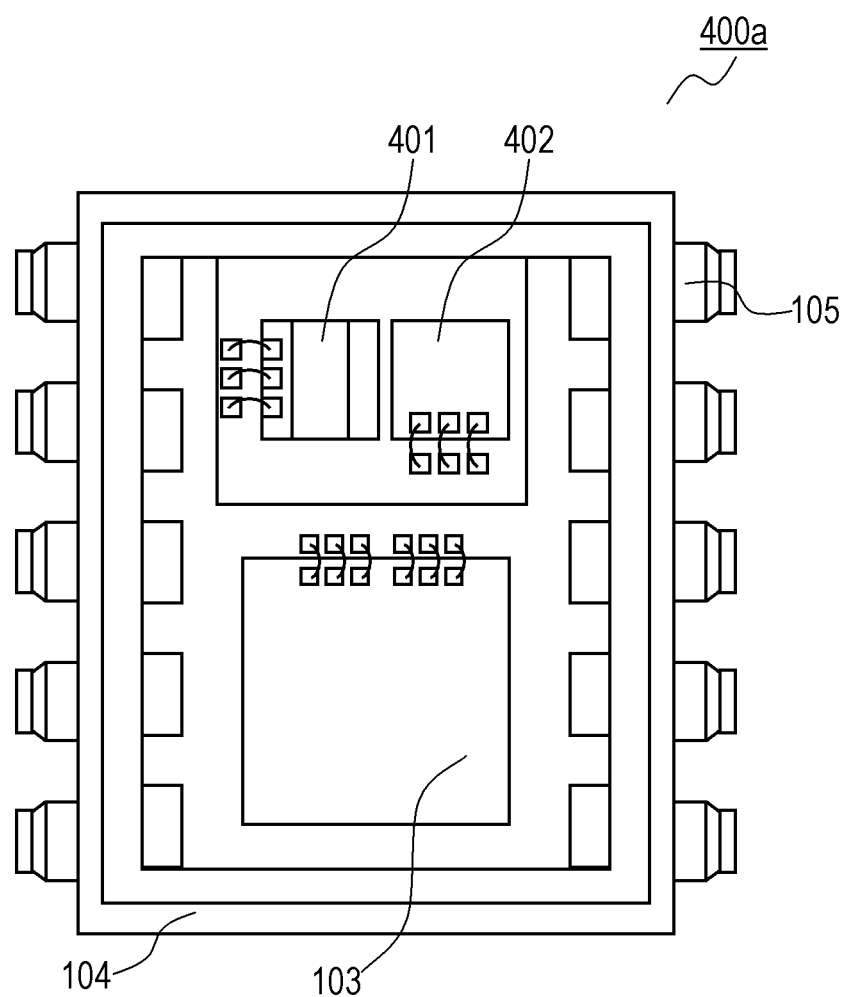
FIG. 27 is a top view of a package substrate of another sensor according to Embodiment 5 for illustrating an inside of the package substrate.
Figure 28:
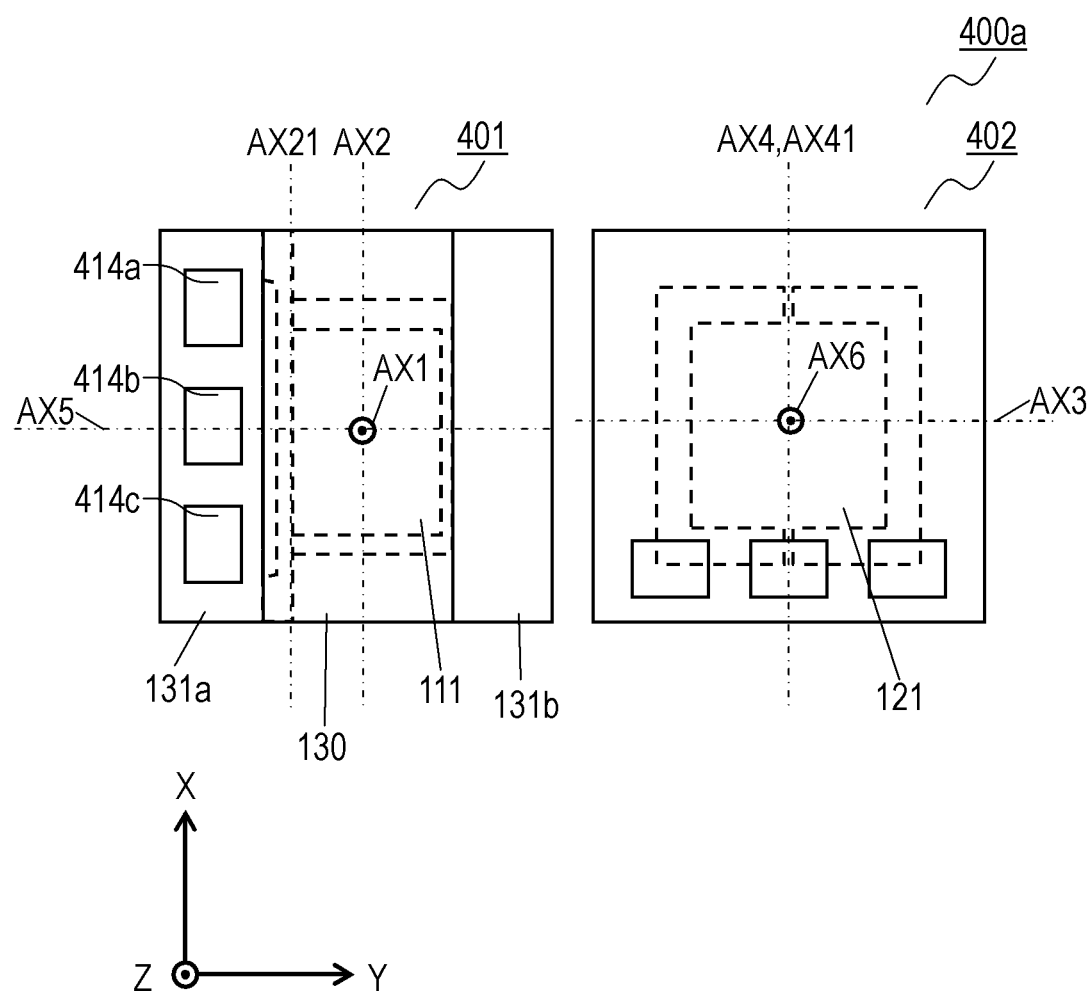
FIG. 28 is a top view of a sensor element of the sensor illustrated in FIG. 27.

FIG. 27 is a top view of package substrate 104 of another sensor 400a according to Embodiment 5 for illustrating an internal configuration of package substrate 104. FIG. 28 is a top view of sensor elements 401 and 402 of sensor 400a. In FIGS. 27 and 28, components identical to those of sensor 400 illustrated in FIGS. 25 and 26 are denoted by the same reference numerals. In sensor 400 illustrated in FIGS. 25 and 26, sensor element 401 and sensor element 402 are directly connected to detection circuit 103. In sensor 400a illustrated in FIGS. 27 and 28, sensor elements 401 and 402 are connected to detection circuit 103 through package substrate 104. In such an arrangement of the via-conductors, the sensor element 401 and sensor element 402 have different configurations and an error in mounting sensor element 401 and sensor element 402 can be reduced, similarly to the configuration described above.

Exemplary Embodiment 6

Figure 29:
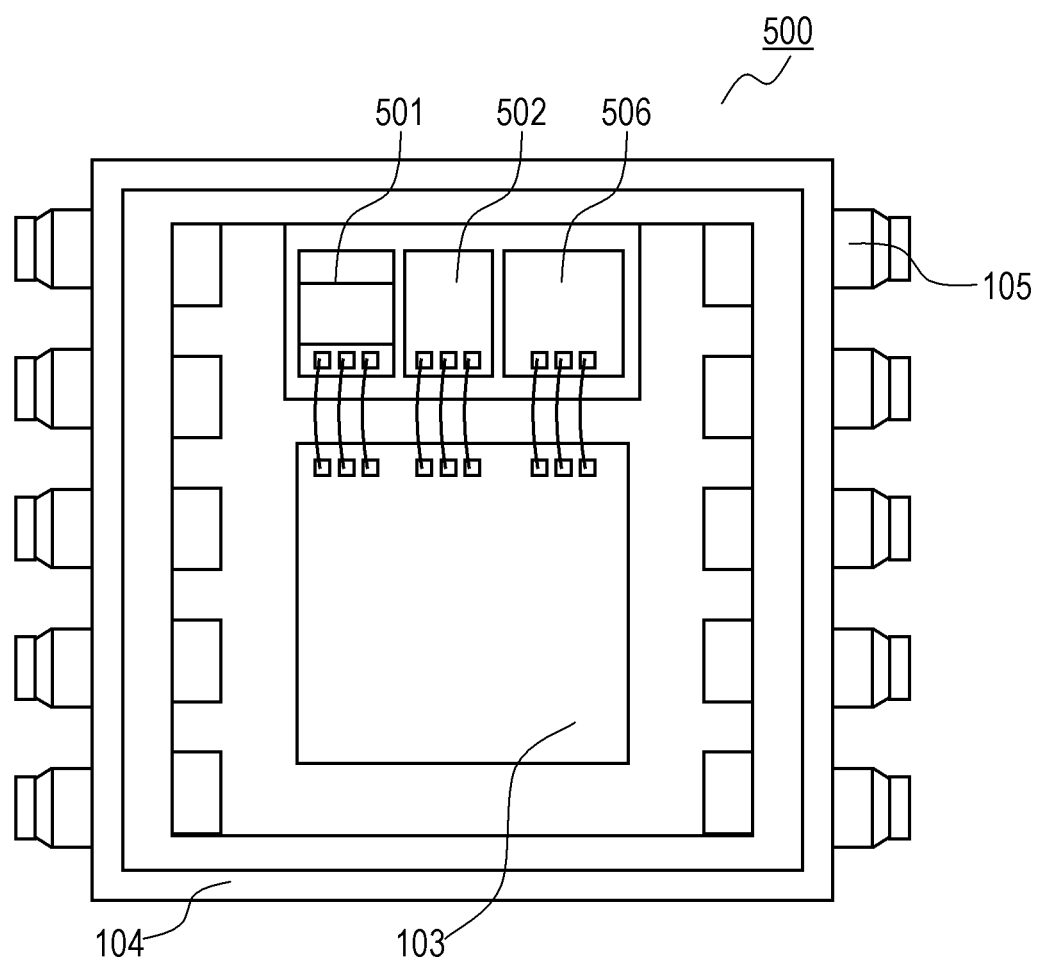
FIG. 29 is a top view of a package substrate of a sensor according to Exemplary Embodiment 6 for illustrating an inside of the package substrate.
Figure 30:
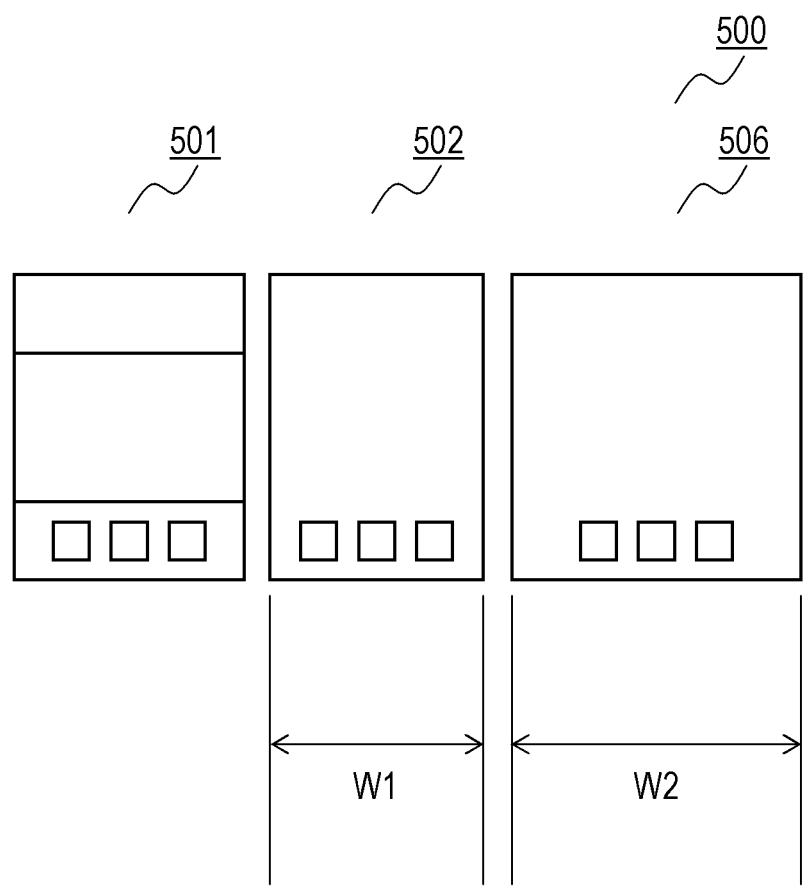
FIG. 30 is a top view of a sensor element of the sensor illustrated in FIG. 29.

FIG. 29 is a top view of package substrate 104 of sensor 500 according to Exemplary Embodiment 6 for illustrating an internal configuration of package substrate 104. FIG. 30 is a top view of sensor elements 501, 502, and 506 of sensor 500. In FIGS. 29 and 30, components identical to those of sensor 100 according to Embodiment 2 illustrated in FIGS. 7A to 16 are denoted by the same reference numerals.

Sensor 500 includes three sensor elements: sensor element 501 that detects an acceleration in a direction along an Z-axis; sensor element 502 that detects an acceleration in a direction along an X-axis; and sensor element 506 that detects an acceleration in a direction along a Y-axis.

As illustrated in FIG. 30, sensor elements 502 and 506 have different widths W1 and W2.

Sensor element 501 includes substrates 130, 131a, and 131b of sensor 101 according to Embodiment 2 stacked on one another and via-conductors connected to fixed electrodes 115a and 115c and common electrode 111m (plummet 111). Sensor element 502 includes substrates 140, 141a, and 141b of sensor 102 according to Embodiment 2 stacked on one another and via-conductors connected to fixed electrodes 125a and 125c and common electrode 121m (plummet 121). Similarly to sensor elements 501 and 502, sensor element 506 includes substrates stacked on one another and via-conductors connected to fixed electrodes and a common electrode (a plummet).

Unlike the sensors according to Embodiments 2 to 5, sensor 500 according to Embodiment 6 can detect accelerations in directions along three axes, i.e., along the X-axis, the Y-axis, and the Z-axis.

This configuration provides an advantage described below in addition to advantages (2), (3), and (4).

(8) Sensitivity to other axes can be reduced.

Advantage (8) will be detailed below. Sensor 500 includes three sensor elements: sensor element 501 that detects an acceleration in a direction along the Z-axis; sensor element 502 that detects an acceleration in a direction along the X-axis, and sensor element 506 that detects an acceleration in a direction along the Y-axis. Thus, sensor 500 can detect accelerations in directions along the X-axis, the Y-axis, and the Z-axis. An output of one sensor element can be corrected based on detection results of the other sensor elements. Thai is, an output for an acceleration in a direction along one axis can be easily corrected based on the axes other than the one axis for detection.

Figure 31:
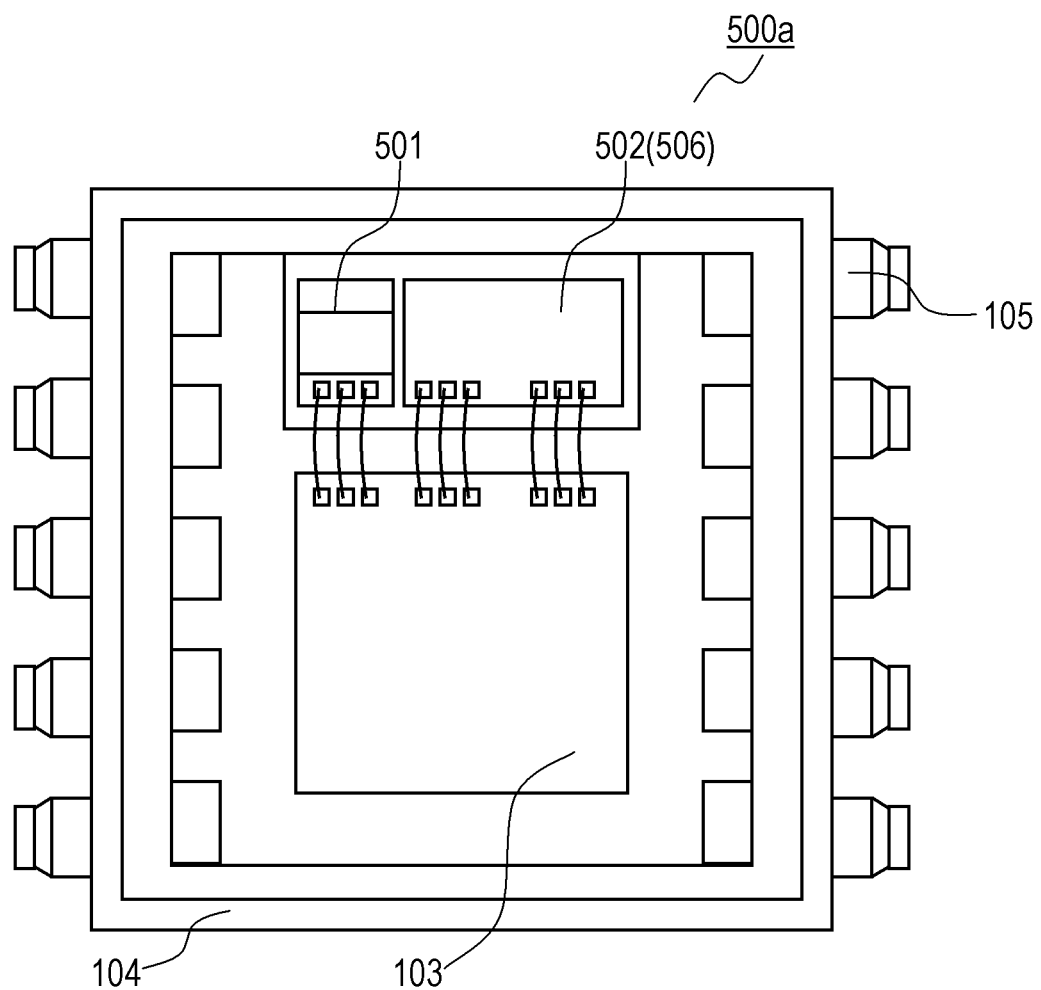
FIG. 31 is a top view of a package substrate of another sensor according to Embodiment 6 for illustrating an internal configuration of the package substrate.

FIG. 31 is a top view of package substrate 104 of another sensor 500a according to Embodiment 6 for illustrating an internal configuration of package substrate 104. In FIG. 31, components identical to those of sensor 500 illustrated in FIGS. 29 and 30 are denoted by the same reference numerals. In sensor 500 illustrated in FIGS. 29 and 30, three sensor elements 501, 502, and 506 are accommodated in package substrate 104. In sensor 500a illustrated in FIG. 31, sensor elements 502 and 506 have the same configuration in the thickness direction, and thus, are integrated.

Specifically, each of three substrates of sensor element 502 can be connected to respective one of three substrates of sensor element 506 so that sensor elements 502 and 506 can be integrated.

In accordance with this embodiment, each sensor element detects an acceleration. However, the present invention is not limited to this example, and a sensor element may detect an angular velocity.

In the foregoing embodiments, terms, such as "upper surface," "lower surface," "upward direction," "top view," and "above," indicating directions indicate relative directions determined based only on relative positional relationships among components of sensors, and do not indicate absolute directions, such as a vertical direction.

Exemplary Embodiment 7

Figure 32:
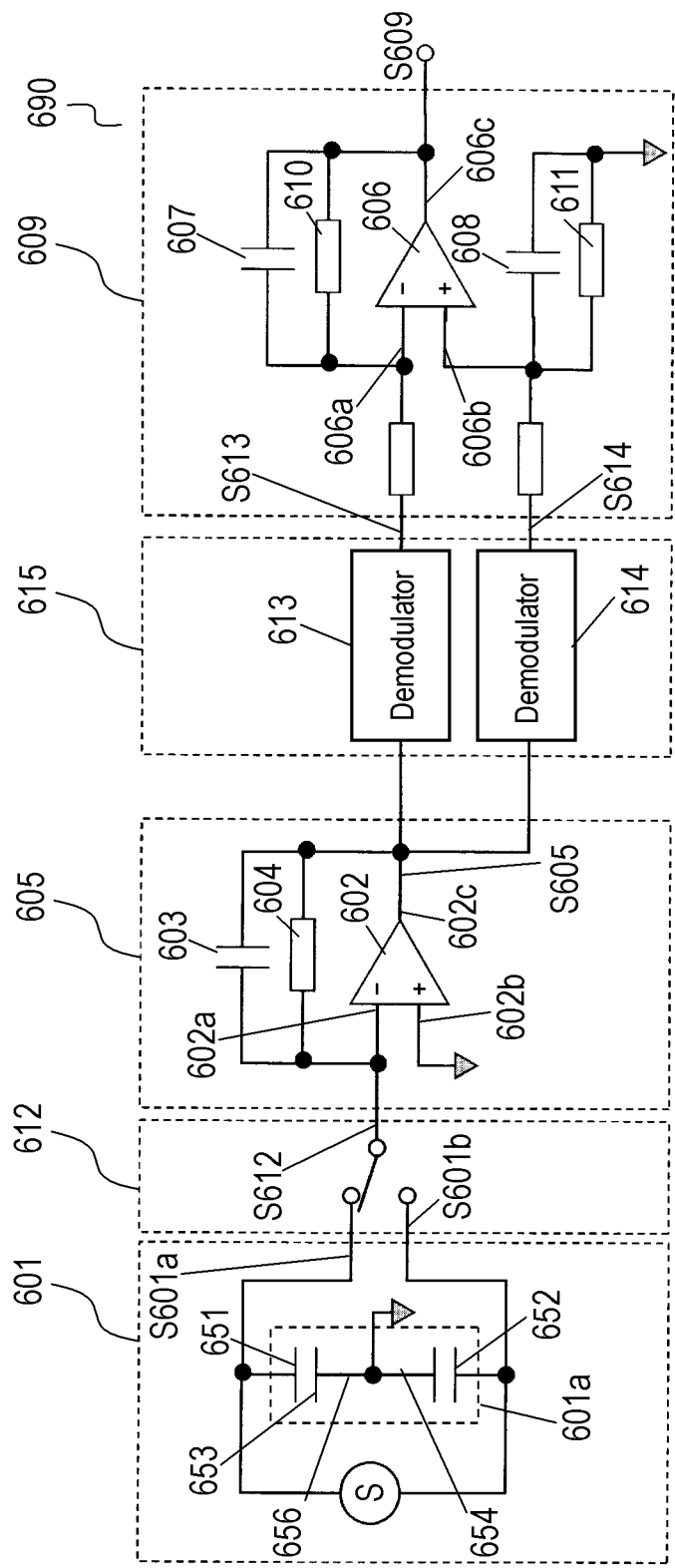
FIG. 32 is a circuit diagram of a sensor according to Exemplary Embodiment 7.

FIG. 32 is a circuit diagram of sensor 690 according to Exemplary Embodiment 7. Sensor 690 includes sensor unit 601, integration unit 605 that integrates an electrical signal output from sensor unit 601, and correlated double sampling unit 609. Integration unit 605 includes operational amplifier 602 having non-inverted input terminal 602b, inverted input terminal 602a, and output terminal 602c, capacitor 603 connected between inverted input terminal 602a and output terminal 602c of operational amplifier 602, and resistor 604 connected in parallel with capacitor 603. Correlated double sampling unit 609 includes operational amplifier 606 having non-inverted input terminal 606b, inverted input terminal 602a, and output terminal 606c. Operational amplifier 606 amplifies a voltage difference between non-inverted input terminal 606b and inverted input terminal 602a, and outputs the resulting signal from output terminal 606c. Sensor 690 may further include switch units 612 and 615.

In the conventional sensor disclosed in PTL 5, noise is insufficiently removed only by removing the noise in an integration unit.

In sensor 690 according to Embodiment 7, correlated double sampling unit 609 serving as a processing circuit at a subsequent stage of integration unit 605 removes noise so that measurement accuracy of sensor 690 can be further enhanced. This process will be described below.

Sensor unit 601 supplies output signals S601a and S601b to switch unit 612. Switch unit 612 alternately outputs output signals S601a and S601b as output signal S612 at period Δt.

Figure 33:
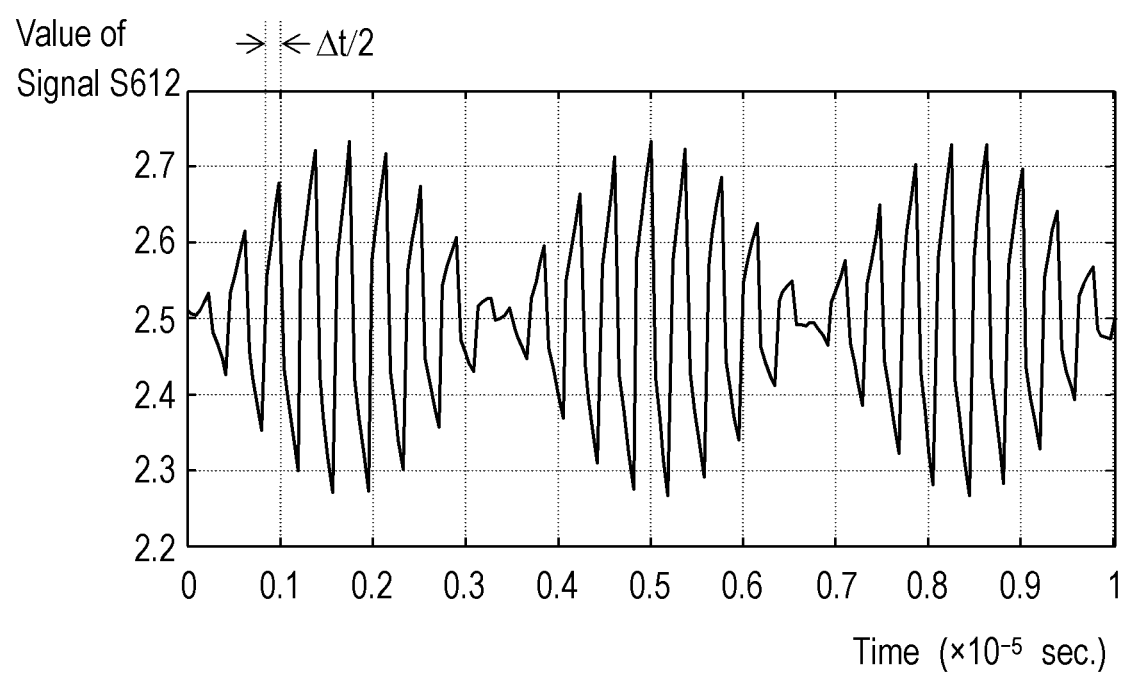
FIG. 33 illustrates a waveform of an output signal output through a switch unit from a sensor unit of the sensor according to Embodiment 7.

FIG. 33 illustrates output signal S612 supplied from sensor unit 601 to integration unit 605 through switch unit 612. In FIG. 33, the horizontal axis time, and the vertical axis represents a value of the output signal. Output signal S612 shown in FIG. 33 has phases reversed every time Δt/2. Output signal S612 contains a noise component having a value that changes randomly with respect to time.

Figure 34A:
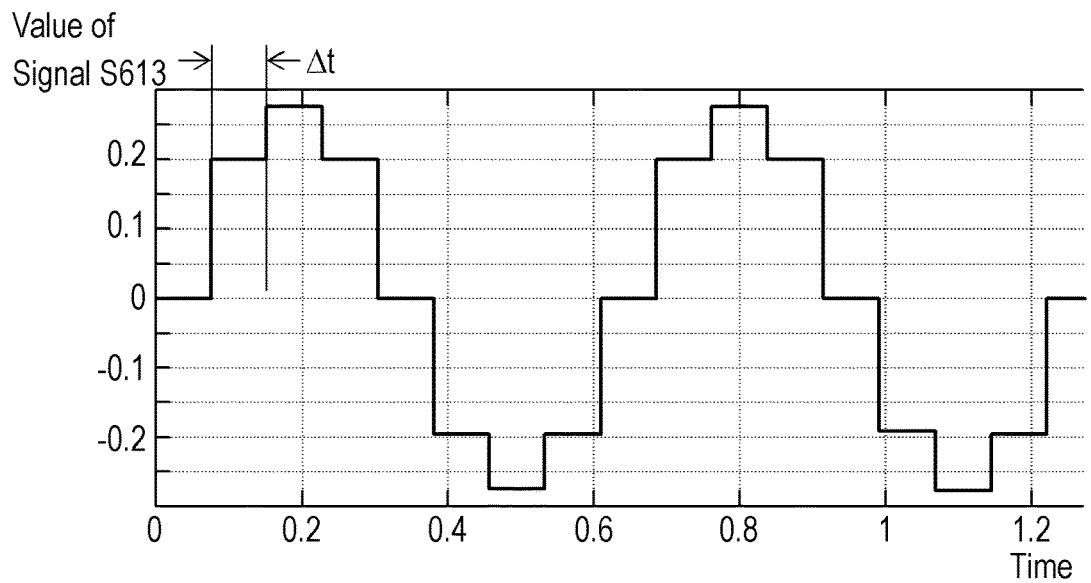
FIG. 34A illustrates a waveform of an output signal supplied to a correlated double sampling unit of the sensor according to Embodiment 7.
Figure 34B:
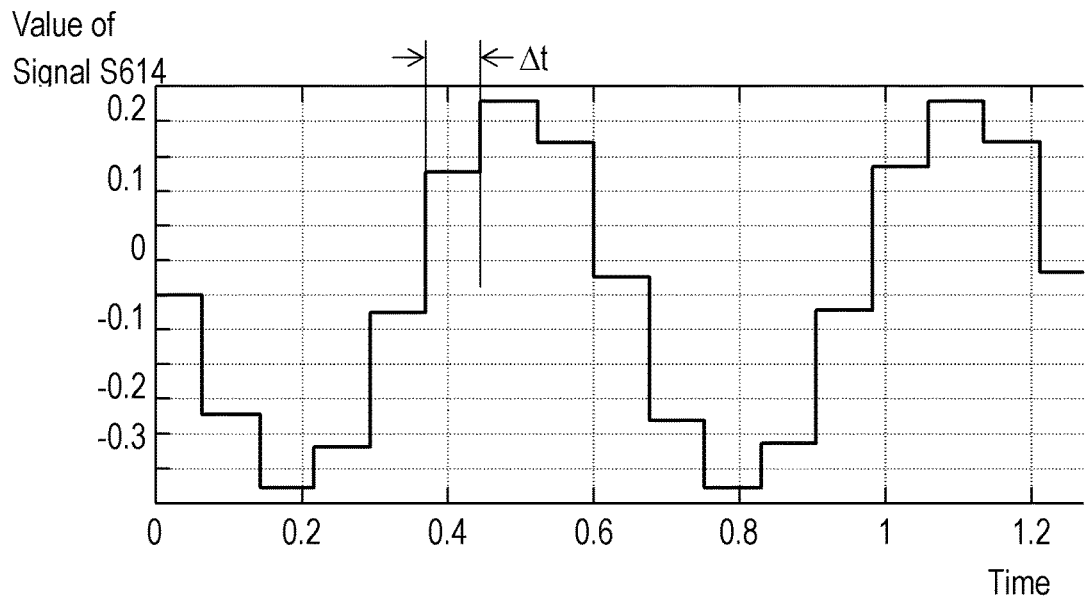
FIG. 34B illustrates a waveform of an output signal supplied to the correlated double sampling unit of the sensor according to Embodiment 7.

An output signal from sensor unit 601 is supplied as output signal S613 to correlated double sampling unit 609 through integration unit 605. An output signal from sensor unit 601 is supplied as output signal S614 to correlated double sampling unit 609 through integration unit 605. Switch unit 615 includes demodulators 613 and 614. Demodulator 613 samples and holds, at period Δt, output signal S605 from integration unit 605, and outputs output signal S613. Demodulator 614 samples and holds output signal S605 at period Δt with a time shift of Δt/2 from signal S613, and outputs output signal S614. FIG. 34A illustrates output voltage S613. FIG. 34B illustrates output voltage S614. In FIGS. 34A and 34B, the horizontal axis represents time, and the vertical axis represents the value of a signal. Noise can be removed by obtaining a difference between output signal S613 and output signal S614. That is, noise components contained in output signals S613 and S614 change randomly. The noise components are cancelled by each other in correlated double sampling unit 609 by determining period Δt to be a small value. Consequently, the accuracy of measurement by sensor 690 can be further enhanced. Integration unit 605 includes capacitor 603 and resistor 604. Thus, as shown in FIG. 33, in the case where an output signal from sensor unit 601 is a continuous signal, capacitor 603 can be effectively charged by output signal S612.

Sensor unit 601 includes sensor element 601a that converts a physical quantity into an electrical signal and outputs the electrical signal. Here, the electrical signal may be a current signal or a voltage signal. Sensor element 601a is, for example, one of the sensor elements according to the above embodiments. Components except sensor element 601a of sensor 690 correspond to circuit component 13a and detection circuits 103, 203, 303, 403, and 503 according to above embodiments.

Capacitor 607 is connected between inverted input terminal 606a and output terminal 606c of operational amplifier 606. Resistor 610 is connected between inverted input terminal 606a and output terminal 606c of operational amplifier 606 and in parallel with capacitor 607. Capacitor 608 is connected between non-inverted input terminal 606b and output terminal 606c of operational amplifier 606. Resistor 611 is connected between non-inverted input terminal 606b and output terminal 606c of operational amplifier 606 and in parallel with capacitor 608.

Capacitor 607 stores output signal S613 output from integration unit 605 through switch unit 615. Capacitor 608 stores output signals S614 output from integration unit 605 through switch unit 615. As illustrated in FIG. 32, correlated double sampling unit 609 preferably outputs a difference between a voltage of capacitor 607 and a voltage of capacitor 608. As described above, operational amplifier 606 functions as an inverting amplifier by obtaining a difference between a signal stored as output signal S613 and a signal stored as output signal S614. Correlated double sampling unit 609 may not include one of capacitors 607 and 608, or may include none of capacitors 607 and 608. As long as correlated double sampling unit 609 can obtain a difference between output signals S613 and S614 having a time shift between the signals, for example, as long as demodulators 613 and 614 at a previous stage of operational amplifier 606 can output output signals S613 and S614 with a time shift, correlated double sampling unit 609 may not include one of capacitors 607 and 608.

As illustrated in FIG. 32, correlated double sampling unit 609 preferably includes resistor 610 connected in parallel with capacitor 607 and resistor 611 connected in parallel with capacitor 608. Correlated double sampling unit 609 may be configured not to obtain a difference between output signal S613 stored in capacitor 607 and output signal S614 stored in capacitor 608. That is, when the frequencies of output signals S613 and S614 are lower than a cut-off frequency of operational amplifier 606, operational amplifier 606 can function as an inverting amplifier. In this case, an actual impedance of a feedback unit is determined based on resistors 610 and 611. On the other hand, when the frequencies of output signals S613 and S614 are higher than the cut-off frequency of operational amplifier 606, operational amplifier 606 can function as an integration circuit. In this case, an impedance of the feedback unit is determined based on capacitors 607 and 608. Thus, resistors 610 and 611 allows operational amplifier 606 to function as both an inverting amplifier and an integration circuit.

Sensor unit 601 can output two output signals S601a and S601b. Sensor 690 may include switch unit 612 that determines one signal out of two output signals S601a and S601b which is output from sensor unit 601. Switch unit 612 causes two output signals S601a and S601b from sensor unit 601 to be selectively obtained periodically. As illustrated in FIG. 33, in the case where sensor unit 601 per se outputs continuous output signal S612 with a phase reversed periodically at period Δt, sensor 690 does not necessarily include switch unit 612.

As illustrated in FIG. 32, demodulator 613 demodulates output signal S605 from integration unit 605 and stores the demodulated signal in capacitor 607. Demodulator 614 demodulates output signal S605 from integration unit 605 and stores the demodulated signal in capacitor 608. Switch unit 615 introduces output signal S605 from integration unit 605 to one of inverted input terminal 606a and non-inverted input terminal 606b of operational amplifier 606. That is, demodulator 613 and demodulator 614 function as switch unit 615. The demodulators per se may have switching functions.

In the case where sensor 690 includes switch unit 612, the frequency (the inverse of period Δt) at which switch unit 612 is switched preferably equal to a frequency at which switch unit 615 is switched. On the other hand, as shown in FIG. 33, in the case where sensor unit 601 outputs continuous output signal S612 with a phase reversed periodically at period Δt, the frequency at which switch unit 615 is switched is preferably the inverse of period Δt, thereby providing output signals S613 and S614 with opposite phases in switch unit 615.

Figure 35:
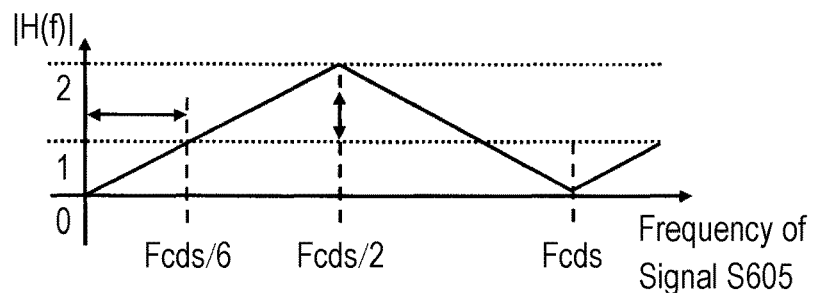
FIG. 35 illustrates a relation between a noise reduction effect and a frequency of an output signal from an integration unit of the sensor according to Embodiment 7.
Figure 36:
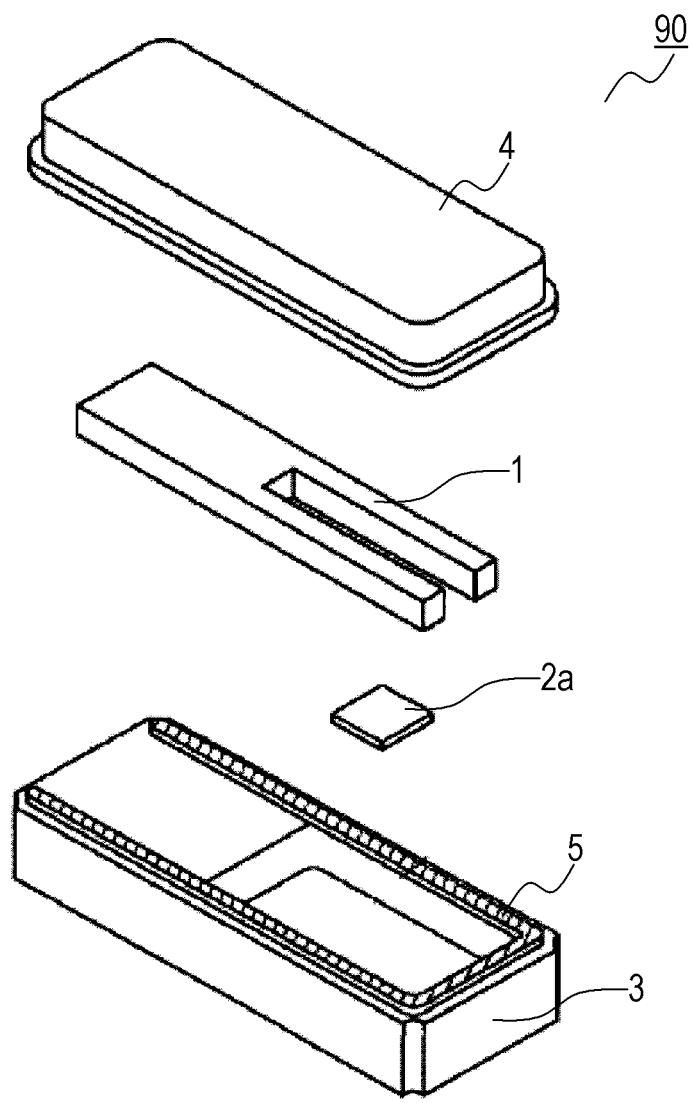
FIG. 36 is an exploded perspective view of a conventional sensor.

The timing for correlated double sampling unit 609 to obtain the difference between output signals S613 and S614 in order to reduce noise will be described below. FIG. 35 shows a relationship between the frequency of output signal S605 from integration unit 605 and a relative effectiveness of a noise reduction effect. In FIG. 35, the horizontal axis represents frequency f605 of output signal S605, and the vertical axis represents the absolute value of a ratio H(f) of the noise quantity in signal S609 output from correlated double sampling unit 609 with respect to each of signals S613 and S614 input to correlated double sampling unit 609. The value "1" on the vertical axis indicates that the amount of noise in a signal input to correlated double sampling unit 609 is equal to the amount of noise in a signal output from correlated double sampling unit 609. The value "2" on the vertical axis indicates that the amount of noise in a signal output from correlated double sampling unit 609 is twice as large as the amount of noise in a signal input to correlated double sampling unit 609. First, correlated double sampling frequency Fcds that is a frequency at which the difference between output signals S613 and S614 is obtained, that is, correlated double sampling unit 609 performs the subtraction process, is preferably as high as possible. The effect of noise reduction increases as the number of subtraction processes increases. However, an increase in the number of subtraction processes increases processing costs accordingly. Thus, noise is preferably sufficiently reduced with reduced processing costs. Noise and correlated double sampling frequency Fcds have correlation. When a difference in noise contained in signals S613 and S614 at correlated double sampling frequency Fcds is obtained, noise at a frequency equal to correlated double sampling frequency Fcds can be completely removed. Here, as shown in FIG. 35, with correlated double sampling, regarding noise for the frequency of output signal S605 from integration unit 605 equal to or lower than Fcds/6, the absolute value of ratio H(f) is not larger than 1 (one), and it was confirmed through experiment that noise is sufficiently reduced. Thus, frequency Fcds of six times or more as high as the frequency of an output signal from the integration unit sufficiently reduces noise at lower processing costs. Correlated double sampling frequency Fcds thus is determined to be six times or more of frequency f605 of output signal S605 from integration unit 605.

Sensor element 601a of sensor unit 601 preferably has a structure including an object periodically movable between two detection electrodes. For example, sensor element 601a includes detection electrode 651, detection electrode 652, and movable unit 656. Movable unit 656 includes electrodes 653 and 654. Capacitor 607 stores an output signal corresponding to a voltage difference between electrode 653 and detection electrode 651. Capacitor 608 preferably stores an output signal corresponding to a voltage difference between electrode 654 and detection electrode 652. Sensor unit 601 outputs output signal S612 shown in FIG. 33 to switch unit 612.

Sensor unit 601 is preferably an angular velocity sensor that can detect an angular velocity or an acceleration sensor that can detect an acceleration. These sensors are sensors each having a structure periodically movable. This structure is also applicable to other types of sensors not having a structure, such as an infrared sensor, periodically movable.

In the case where sensor unit 601 is an angular velocity sensor, sensor 690 preferably includes one correlated double sampling unit 609 corresponding to one angular velocity sensor. Specifically, in the case where sensor 690 includes an angular velocity sensor that detects an angular velocity about the X-axis and an angular velocity sensor that detects an angular velocity about the Y-axis independently of each other, sensor 690 preferably includes correlated double sampling unit 609 for the X-axis angular velocity sensor and another correlated double sampling unit 609 for the Y-axis angular velocity sensor. That is, the number of sensor units 601 is preferably equal to the number of correlated double sampling units 609. Similarly, sensor 690 preferably includes integration unit 605 for the X-axis angular velocity sensor and integration unit 605 for the Y-axis angular velocity sensor. That is, the number of sensor units 601 is preferably equal to the number of integration units 605. Sensor 690 may include one correlated double sampling unit 609 for angular velocity sensors that detects plural angular velocities about plural axes. In this case, the number of parts is reduced, which contributes to size reduction.

Sensor 690 according to Embodiment 7 can remove noise components precisely, and can further enhance measurement accuracy. In particular, sensor 690 is useful for enhancing measurement accuracy of an angular velocity sensor or an acceleration sensor.

REFERENCE MARKS IN THE DRAWINGS 1 sensor element
2 circuit component
3 package
4 metal lid
5 electrode 10, 10a, 10b sensor
11 lead
11a lead portion (first portion)
11b lead portion (second portion)
11c tip
12 sensor element
13a circuit component
14 package
14k space
15 grounding electrode
16 lid
19, 21 gap
20 recess
30 terminal
40 end
100, 300, 400, 500 sensor
101, 102, 152 sensor element
301, 302, 401, 402 sensor element
501, 502, 506 sensor element
103 detection circuit
104 package substrate
104a, 204a, 204b recess
105 lead terminal
106 external substrate
111 plummet
112a, 112b beam
113, 123 support part
114a, 114b, 124a, 124b, 124c via-conductor
174a, 174c via-conductor
314a, 314b, 314c, 324a, 324b, 324c via-conductor
414a, 414b, 414c, 424a, 424b, 424c via-conductor
115a, 115c, 125a, 125c fixed electrode
121 plummet
122a, 122b beam
130 substrate
131a substrate
131b substrate
140 substrate
141a substrate
141b substrate
1314a, 1314b, 1314c conductive wire
1324a, 1324b, 1324c conductive wire
AX1 to AX6 axis
AX21, AX41 support axis
601 sensor unit
602 operational amplifier (first operational amplifier)
603 capacitor (first capacitor)
604 resistor (first resistor)
605 integration unit
606 operational amplifier (second operational amplifier)
607 capacitor (second capacitor)
608 capacitor (third capacitor)
609 correlated double sampling unit
610 resistor (second resistor)
611 resistor (third resistor)
612 switch unit (first switch unit)
613 demodulator (first demodulator)
614 demodulator (second demodulator)
615 switch unit (second switch unit)

The invention claimed is:

1. A sensor comprising:
a sensor element;
a package accommodating the sensor element in an inside of the package; a grounding electrode disposed in the package;
a lid covering an opening of the package; and
a lead extending from the package,
wherein the lead includes:
a first portion electrically connected to the grounding electrode and extending along a side surface of the package with a gap provided between the first portion and the side surface, and
a second portion disposed between the lid and the package and extending toward the inside of the package,
wherein a tip of the second portion of the lead is pressed onto the lid by a spring force, and
wherein the lid is crimped by a part of the package to be fixed to the package.

2. The sensor of claim 1, wherein at least a portion of the side surface facing the gap inclines toward the inside as the side surface approaches the lid.

3. The sensor of claim 1, further comprising a circuit component accommodated in the package.

4. The sensor of claim 1, wherein the sensor element detects an acceleration.

5. The sensor of claim 4, wherein the circuit component processes a detection signal from the sensor element and outputs an acceleration signal corresponding to the detected acceleration.

6. The sensor of claim 1, further comprising:
a plurality of connection leads extending from the package and connected to an external substrate,
wherein at least one of the plurality of connection leads is the grounding electrode.

7. The sensor of claim 1, wherein the second portion has a tip projecting from an inner wall surface of the package toward the inside of the package.

8. The sensor of claim 1, wherein the lid is made of a metal material.

9. The sensor of claim 1, wherein the package is made of a resin material.

10. The sensor of claim 1, wherein the second portion of the lead includes a plurality of portions separated by a slit.

11. The sensor of claim 1, wherein the second portion of the lead has a projection.

12. A sensor comprising:
a sensor element;
a package accommodating the sensor element in an inside of the package;
a grounding electrode disposed in the package;
a lid covering an opening of the package;
a lead extending from the package;
a sensor unit including the sensor element; and
a circuit component that processes a signal output from the sensor unit,
wherein the lead includes:
a first portion electrically connected to the grounding electrode and extending along a side surface of the package with a gap provided between the first portion and the side surface; and
a second portion disposed between the lid and the package and extending toward the inside of the package,
wherein a tip of the second portion of the lead is pressed onto the lid by a spring force,
wherein the circuit component includes,
a first operational amplifier having a first non-inverted input terminal, a first inverted input terminal, and an output terminal,
a first capacitor connected between the first inverted input terminal and the output terminal of the first operational amplifier;

a first resistor connected in parallel with the first capacitor;

an integration unit that integrates an electrical signal output from the sensor unit; and a correlated double sampling unit including a second operational amplifier having a second non-inverted input terminal and a second inverted input terminal, the a second operational amplifier being configured to amplify a voltage difference between the second non-inverted input terminal and the second inverted input terminal, wherein the correlated double sampling unit further includes:

a second capacitor that stores an output signal output from the integration unit; and a third capacitor that stores the output signal output from the integration unit, and wherein the correlated double sampling unit outputs a difference between a voltage of the second capacitor and a voltage of the third capacitor.

13. The sensor of claim 12, wherein the correlated double sampling unit further includes:

a second resistor connected in parallel with the second capacitor; and a third resistor connected in parallel with the third capacitor.

14. The sensor of claim 12, wherein the sensor unit includes a first electrode, a second electrode, a third electrode, and a fourth electrode, wherein the second capacitor stores an output signal corresponding to a voltage difference between the third electrode and the first electrode, and wherein the third capacitor stores an output signal corresponding to a voltage difference between the fourth electrode and the second electrode.

15. The sensor of claim 12, wherein an output signal output from the sensor unit is a continuous signal.

16. The sensor of claim 12, further comprising:

a plurality of sensor units including the sensor unit;

a plurality of correlated double sampling units including the correlated double sampling unit, wherein the number of the plurality of sensor units is equal to the number of the plurality of correlated double sampling units.

17. A sensor of comprising:

a sensor element;

a package accommodating the sensor element in an inside of the package;

a grounding electrode disposed in the package;

a lid covering an opening of the package;

a lead extending from the package;

a sensor unit including the sensor element; and a circuit component that processes a signal output from the sensor unit, wherein the lead includes:

a first portion electrically connected to the grounding electrode and extending along a side surface of the package with a gap provided between the first portion and the side surface, and a second portion disposed between the lid and the package and extending toward the inside of the package, wherein a tip of the second portion of the lead is pressed onto the lid by a spring force, wherein the circuit component includes;

a first operational amplifier having a first non-inverted input terminal, a first inverted input terminal, and an output terminal;

a first capacitor connected between the first inverted input terminal and the output terminal of the first operational amplifier;

a first resistor connected in parallel with the first capacitor;

an integration unit that integrates an electrical signal output from the sensor unit; and a correlated double sampling unit including a second operational amplifier having a second non-inverted input terminal and a second inverted input terminal, the a second operational amplifier being configured to amplify a voltage difference between the second non-inverted input terminal and the second inverted input terminal, and wherein the sensor unit is capable of outputting two output signals, the sensor further comprising a first switch unit that determines an output signal out of the two output signals from the sensor unit to be supplied to the integration unit.

18. The sensor of claim 17, further comprising a second switch unit including:

a first demodulator that demodulates an output signal from the integration unit and stores the signal demodulated by the first demodulator in the second capacitor; and a second demodulator that demodulates the output signal from the integration unit and stores the signal demodulated by the second demodulator in the third capacitor, wherein the first demodulator and the second demodulator introduce an output signal from the integration unit to one of the second inverted input terminal and the second non-inverted input terminal of the second operational amplifier.

19. The sensor of claim 18, wherein a frequency at which the first switch unit is switched is equal to a frequency at which the second switch unit is switched.

20. A sensor comprising:

a sensor element;

a package accommodating the sensor element in an inside of the package;

a grounding electrode disposed in the package;

a lid covering an opening of the package; and a lead extending from the package, wherein the lead includes:

a first portion electrically connected to the grounding electrode and extending along a side surface of the package with a gap provided between the first portion and the side surface, and a second portion disposed between the lid and the package and extending toward the inside of the package, and wherein the lid is crimped by a part of the package to be fixed to the package.

* * * * *